(12) United States Patent
Meijer et al.

(10) Patent No.: US 11,391,793 B2
(45) Date of Patent: Jul. 19, 2022

(54) DEVICE AND METHOD FOR GENERATING AND CONTROLLING A MAGNETIC FIELD STRENGTH

(71) Applicant: Quantum Technologies UG, Leipzig (DE)

(72) Inventors: Jan Berend Meijer, Leipzig (DE); Robert Staacke, Leipzig (DE); Florian Neuhäuser, Leipzig (DE); Roger John, Leipzig (DE); Mario Bähr, Osthausen (DE); Bernd Burchard, Essen (DE)

(73) Assignee: Quantum Technologies UG, Leipzig (DE)

( * ) Notice: Subject to any disclaimer, the term of this patent is extended or adjusted under 35 U.S.C. 154(b) by 0 days.

(21) Appl. No.: 17/290,377

(22) PCT Filed: Nov. 1, 2019

(86) PCT No.: PCT/EP2019/079992
§ 371 (c)(1),
(2) Date: Apr. 30, 2021

(87) PCT Pub. No.: WO2020/089465
PCT Pub. Date: May 7, 2020

(65) Prior Publication Data
US 2021/0405129 A1      Dec. 30, 2021

(30) Foreign Application Priority Data
Nov. 2, 2018    (DE) .................... 10 2018 127 394.0

(51) Int. Cl.
*G01R 33/032*    (2006.01)
*G05F 7/00*      (2006.01)

(52) U.S. Cl.
CPC ............. *G01R 33/032* (2013.01); *G05F 7/00* (2013.01)

(58) Field of Classification Search
CPC ................................ G01R 33/032; G05F 7/00
(Continued)

(56) References Cited

U.S. PATENT DOCUMENTS

2016/0116553 A1    4/2016  Kim et al.
2017/0067969 A1*   3/2017  Butters .................. G01N 27/72
(Continued)

FOREIGN PATENT DOCUMENTS

DE    2318335 A1    10/1974
DE    1322830 A1    1/1995
(Continued)

OTHER PUBLICATIONS

Burchard, Bernd; Universität Hagen: Elektronische und optoelektronische Bauelemente und Bauelementstrukturen auf Diamantbasis. 1994. S. 1-250.—Dissertation.
(Continued)

*Primary Examiner* — Christopher P McAndrew
(74) *Attorney, Agent, or Firm* — Smartpat PLC

(57) ABSTRACT

A device for generating and controlling a magnetic field strength and a method for generating and controlling a magnetic field strength are disclosed. The generation is very stable and precise. Preferably, reference values of physical variable can be generated relatively simply and economically. In addition, magnetic flux densities can be measured with high resolution and, in particular, highly robustly. The device and the method can also be used for transmitting information, in particular for ultra-wide band communication. The required devices can be very small, in particular miniature, and mobile.

18 Claims, 15 Drawing Sheets

(58) Field of Classification Search
USPC .................................................. 324/244.1
See application file for complete search history.

(56) References Cited

U.S. PATENT DOCUMENTS

| | | | |
|---|---|---|---|
| 2017/0343695 A1* | 11/2017 | Stetson | G01V 3/101 |
| 2019/0154766 A1 | 5/2019 | Lutz et al. | |

FOREIGN PATENT DOCUMENTS

| | | | |
|---|---|---|---|
| DE | 10000707 A1 | 7/2001 | |
| DE | 102010060527 | 4/2012 | |
| DE | 102015208151 A1 | 11/2016 | |
| DE | 102017205099 A1 | 9/2018 | |
| WO | 2017189113 A2 | 11/2017 | |
| WO | 2018174912 A1 | 9/2018 | |
| WO | WO-2018174912 A1 * | 9/2018 | G01R 33/00 |

OTHER PUBLICATIONS

Jirberg, Russell J, Automatic Distortionless Control of Magnetic Field Modulation, Review of scientific instruments, Jan. 1, 1969, vol. 40, No. 1, pp. 173-174.

Kammeyer, Karl-Dirk; Bossert, Martin ; Fliege, Norbert (Editors): Nachrichtenübertragung. 5., durchges. und erg. Aufl.. Wiesbaden, DE : Vieweg + Teubner, 2011. Deckblatt u. Inhaltsverzeichnis.—ISBN 978-3-8348-0896-7, 3-8348-0896-2. URL: http://scans.hebis.de/HEBCGI/show.pl?27329511_toc.pdf [retrieved Apr. 8, 2021].

Lepper J.: Der Zusammenhang von Elektronenemission und Lumineszenzerscheinungen angeregter Kristalle. In: Zeitschrift für Naturforschung A, Bd. 10, 1955, H. 1, S. 47-52.—ISSN 0932-0784 (P), 1865-7109 (E). DOI: 10.1515/zna-1955-0108. URL: https://www.degruyter.com/downloadpdf/j/zna.1955.10.issue-1/zna-1955-0108/zna-1955-0108.pdf [retrieved Apr. 8, 2021].

Mertins, Alfred: Signaltheorie : Grundlagen der Signalbeschreibung, Filterbänke, Wavelets, Zeit-Frequenz-Analyse, Parameter- und Signalschätzung. 3., überarb. und erw. Aufl.. Wiesbaden, DE : Springer + Vieweg, 2013. Deckblatt u. Inhaltsverzeichnis.—ISBN 978-3-8348-1394-7, 3-8348-1394-X. URL: http://www.gbv.de/dms/ilmenau/toc/668330147.PDF [retrieved am Apr. 8, 2021].

Ohm, Jens-Rainer ; Lüke, Hans Dieter: Signalubertragung : Grundlagen der digitalen und analogen Nachrichtenübertragungssysteme. 12., aktualisierte Aufl.. Berlin : Springer + Vieweg, 2015 (Springer-Lehrbuch). Deckblatt u. Inhaltsverzeichnis.—ISBN 978-3-642-53900-8, 3-642-53900-9. URL: https://d-nb.info/1062811720/04 [retrieved Apr. 8, 2021].

Sghimizu, M. et al.: Charge state modulation of nitrogen vacancy centers in diamond by applying a forward voltage across a p-i-n junction. In: Diamond and Related Materials, Bd. 63, 2016, S. 192-196.—ISSN 0925-9635 (P), 1879-0062 (E). DOI: 10.1016/j.diamond.2015.10.022. URL: https://www.sciencedirect.com/science/article/pii/S0925963515300728/pdfft?md5=d1b3696e62781a9e41fc44ac6b12b8cc&pid=1-s2.0-S0925963515300728-main.pdf [abgerufen am Mar. 13, 2019].

Shao Linbo et al, "Diamond color center based FM microwave demodulator", 2016 Conference On Lasers and Electro-Optics (CLEO), OSA,Jun. 5, 2016 (Jun. 5, 2016), p. 1-2, XP033025062, 20-22, abstract; figures 1,2.

Shao, Linbo et al, "Wide-Field Optical Microscopy of Microwave Fields Using Nitrogen-Vacancy Centers in Diamonds", Advanced Optical Materials,vol. 4, No. 7, Jul. 1, 2016 (Jul. 1, 2016), p. 1075-1080, XP055450437 DOI: 10.1002/adom.201600039 external link ISSN:2195-1071 20-22 abstract; figure 4.

Tegetmeyer, Björn [et al.]: Electroluminescence from silicon vacancy centers in diamond p-i-n diodes. In: Diamond and Related Materials, 65, 2016, pp. 42-46, Jan. 26, 2016.

Wickenbrock, Arne [u.a.]: Microwave-free magnetometry with nitrogen-vacancy centers in diamond. In: Applied Physics Letters (APL), Bd. 109, 2016, H. 5, Artikelnummer: 053505.—ISSN 0003-6951 (P), 1077-3118 (E). DOI: 10.1063/1.4960171. URL: https://aip.scitation.org/doi/pdf/10.1063/1.4960171?class=pdf [abgerufen am Mar. 11, 2019].

Zaitsev, Alexander M.: Optical properties of diamond: a data handbook. Berlin, DE [u.a.]: Springer-Verlag, 2001. Deckblatt u. Inhaltsverzeichnis.—ISBN 354066582X, 3540414487. URL: http://www.gbv.de/dms/ohb-opac/329724940.pdf.

* cited by examiner

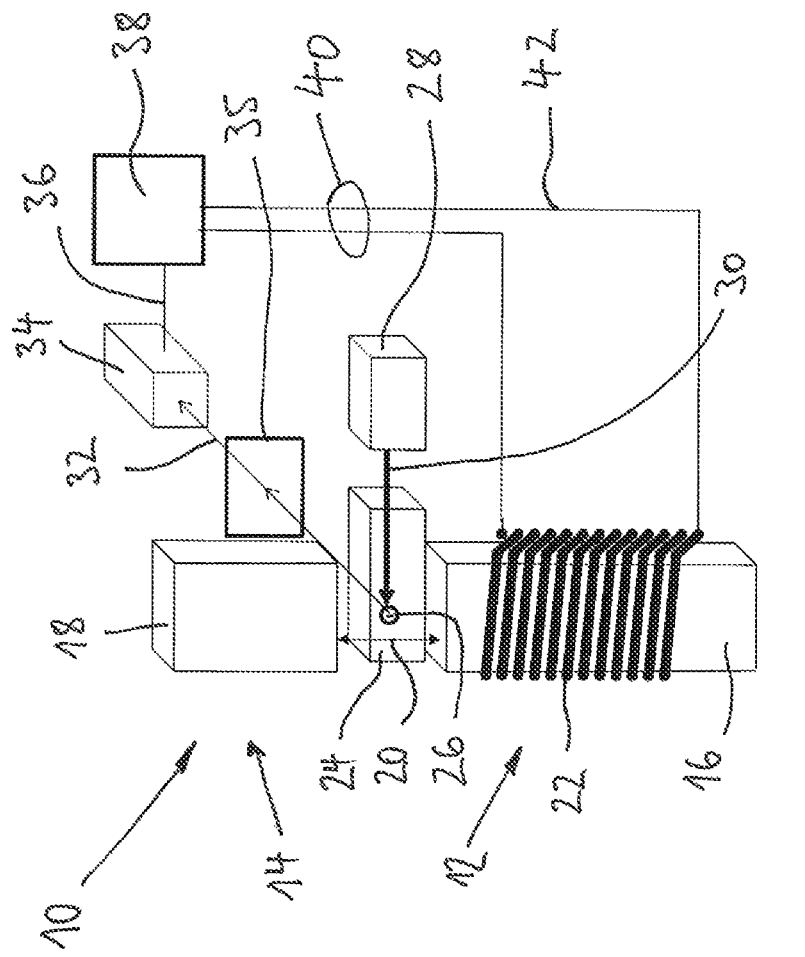

DEVICE AND METHOD FOR GENERATING AND CONTROLLING A MAGNETIC FIELD STRENGTH

CROSS-REFERENCE TO RELATED APPLICATION

This application is a national stage application, filed under 35 U.S.C. § 371, of International Patent Application No. PCT/EP2019/079992, filed on Nov. 1, 2019, which claims the benefit of German Patent Application No. 10 2018 127 394.0, filed Nov. 2, 2018.

TECHNICAL FIELD

The present disclosure relates to a device for generating and controlling a magnetic field strength, and to a method for generating and controlling a magnetic field strength.

BACKGROUND

Magnetic fields and associated specific magnetic field strengths are usually generated by means of coil arrangements. The problem is that, in doing so, external magnetic fields cannot be taken into account. These can only be eliminated via magnetic shielding.

An equally difficult object is to generate reference values of physical variables. Such reference values are very important in science and technology. This is immediately obvious with respect to time, yet reference values are also very important as base values for other physical variables, such as current strength, voltage, magnetic field, electric field and the like.

The reference value for time is the second, which is defined as 9,192,631,770 times the period of the radiation corresponding to the transition between the two hyperfine levels of the ground state of atoms of the cesium isotope $^{133}$Cs. Reference value transmitters for presetting the duration of a second are known through so-called "atomic clocks."

For the length, a reference value for the meter can be derived from the definition that one meter is equal to the length of the distance that light travels in a vacuum during 1/299792458th of a second. Such reference value is therefore traced back to the reference value for time.

Current strength is defined by the fact that 1 A is the strength of the time-constant electric current that would produce a force of $2 \cdot 10^{-7}$ Newtons per meter of conductor length in a vacuum between two parallel, infinitely long, straight conductors of a negligibly small, circular cross-section and the distance of 1 m between such conductors. From this, it is not possible to find a direct solution for providing a reference value for current strength that is both economical and practical. This also applies, for example, to voltage, magnetic field and electric field.

Finally, the measurement of magnetic flux densities is a basic function of sensor technology, whereby the goal is to further improve the resolution and robustness of corresponding sensors.

From DE 10 2015 208 151 A1 and DE 10 2017 205 099 A1, methods are known with which the fluorescence intensity of a diamond material with a nitrogen-vacancy center is evaluated in order to be able to deduce the magnetic field acting on the nitrogen-vacancy center and the electric current of a conductor causing such magnetic field. Thereby, two different excitations, specifically an optical and a microwave excitation of the nitrogen vacancy center, are used, which makes the corresponding device expensive and complex.

From A. Wickenbrock et al. "Microwave-free magnetometry with nitrogen-vacancy centers in diamond," Appl. Phys. Lett. 109, 053505 (2016), the measurement of magnetic fields without the use of microwaves is known. However, the problem exists that the flux density must be precisely adjusted.

Within the framework of the present disclosure, the magnetic field is distinguished between magnetic field strength (magnetic intensity) and magnetic flux density. Strictly speaking, the magnetic flux density B depends on the magnetic intensity H according to the relation $B=\mu_0 \mu_r H$, where $\mu_0$ is the vacuum permeability and $\mu_r$ is the relative permeability. Thereby, the magnetic flux density is measured, while a magnetic field with a certain field strength is generated when current flows through a conductor, in particular a coil.

SUMMARY

It is the object of the present disclosure to provide a device and a method with which a magnetic field strength can be generated and controlled. Preferably, this is to eliminate one or more of the aforementioned disadvantages. Preferentially, this is to allow a reference value of a physical variable to be generated relatively simply and economically. In particular, the device is also to be very small and used in mobile form. Furthermore, it would be advantageous if the device could also be used to measure magnetic flux densities with high resolution and, in particular, highly robustly.

Such object is achieved with the device as claimed and the method as claimed.

On the part of the inventor, it was recognized that this object can be achieved in a surprising way by the fact that the magnetic field strength is traced back to a resonance extreme value in the luminescence, which is dependent on it in a material, or in the photocurrent, as the case may be. Since this dependence is very well known and also very stable, corresponding magnetic field strengths can be controlled very reliably and reproducibly. More precisely, the magnetic field strength essentially depends on the magnetic flux density B triggering the resonance extreme value at the location of the luminescence or the photocurrent center, as the case may be, and thus advantageously exclusively depends on natural constants that do not require calibration. For example, the resonance point represents a pole of the inverted luminescence value as a function of the magnetic flux density B. Due to this point-shaped resonance point in relation to the parameter of the magnetic flux density B, the smallest deviations of the magnetic flux B lead to a very high signal sensitivity, such that the magnetic field strength can be generated very accurately, independent of other influences. From the literature (see, for example, J. Lepper, "*Der Zusammenhang von Elektronenemission und Lumineszenz-erscheinungen angeregter Kristalle,*" Z. Naturforschg. 10a, 47-52 (1955), it is known that there is a close relationship between the luminescence and the photocurrent.

The device for generating and controlling a magnetic field strength is characterized by:
  a first material that generates a luminescence and/or a photocurrent upon physical excitation, wherein the luminescence or the photocurrent, as the case may be, has an extreme value (in the form of a resonance) with respect to a magnetic field at at least one magnetic flux density, means for generating the physical excitation, means for magnetic field generation, wherein the first material is exposed to the generated magnetic field, wherein the magnetic field strength is adjustable, means for measuring the luminescence or the photocurrent, as the case may be, with a detection signal that represents the strength of the detected luminescence signal or photocurrent signal, as the case may be, means for control, which are adapted to output a control signal for controlling the means for magnetic field generation and to control the magnetic field strength as a function of the detection signal, such that the detection signal assumes an extreme value.

"Means for generating the physical excitation" means any means by which the physical excitation can be generated. In doing so, it does not matter that the magnitude of the physical excitation is actually variable. It is sufficient if the physical excitation can be generated such that the resonance occurs in the luminescence or the photocurrent, as the case may be. In a preferred further development, the magnitude of the excitation, for example its frequency, can be tuned discretely or continuously over at least a certain range by the means for generating the physical excitation.

To determine the extreme value, there may preferentially be means for detecting the first and/or the second derivative of the detection signal as a function of the magnetic flux density. While maxima or minima, as the case may be, in the detection signal can be determined via zero points in the first derivative, extreme values in the first derivative can be controlled via zero points in the second derivative. The second variant is highly advantageous, because at that point control can take place with the highest sensitivity. "Extreme value in the detection signal" thus means not only a maximum or minimum, as the case may be, in the detection signal, but also a maximum or minimum in the first derivative of the detection signal; "extreme value in the detection signal" is thus preferentially to be read as "extreme value in the detection signal or in the first derivative of the detection signal."

In an advantageous further development, means are provided for generating a physical variable as a function of the control signal. This allows reference values to be produced very accurately and reproducibly. Thereby, a strict distinction is made between "physical variable," which refers to the reference value, and "physical excitation," which refers to a specific physical variable that is used to generate the luminescence or the photocurrent, as the case may be, in the material.

In an advantageous further development, it is provided that the physical variable is a variable from the group consisting of electric current, electric voltage, magnetic field (magnetic flux density B or magnetic field strength H), electric field, time and frequency. Such reference values are needed particularly often and for different fields of application.

In an advantageous further development, it is provided that the means for generating the physical variable comprises at least one element selected from the following group: Current mirror, source impedance, coil, capacitor, transconductance amplifier and operational amplifier. Then, reference values for electric current, electric voltage, magnetic field, electric field, time and frequency can be generated.

In an advantageous further development, it is provided that furthermore there are:

a further material that generates a luminescence and/or a photocurrent upon a further physical excitation, wherein the luminescence or the photocurrent, as the case may be, has an extreme value (in the form of a resonance) with respect to a magnetic field at at least one magnetic flux density, further means of generating the further physical excitation, further means for magnetic field generation, wherein the further material is exposed to the generated magnetic field, wherein the magnetic field strength is adjustable, wherein the further means for magnetic field generation is adapted to expose the further material to the same or a different magnetic field as the first material, further means for measuring the luminescence or the photocurrent, as the case may be, of the further material with a further detection signal, which represents the strength of the detected further luminescence signal or the further photocurrent signal, as the case may be. At that point, gradients in a magnetic field can be determined very easily. Instead of a combination of this further material and the further means, any combination thereof or even the further material or any of the further means alone may be used. A plurality of further materials and/or a plurality of further means can also be used.

The "physical excitation" can be identical to the "further physical excitation," such that the "means for generating the physical excitation" can also be identical to the "further means for generating the further physical excitation." Moreover, the "means for magnetic field generation" can be identical to the "further means for magnetic field generation."

In an advantageous further development, it is provided that the first material and/or the further material has a crystal structure with at least one vacancy, wherein the first material or the further material, as the case may be, is preferably diamond, silicon carbide or silicon and the vacancy is a color center, in particular a nitrogen vacancy center or a nitrogen vacancy center in conjunction with a europium vacancy center, a vanadium vacancy center or a manganese vacancy center. When using diamond, the use of ST1 and L2 centers is also conceivable. Preferably, it is a fluorescent material. Such materials have very well-known resonance points in their luminescence. At this point, reference should be made to A. Zaitsev, "Optical Properties of Diamond," 2001, Springer, Berlin, where numerous suitable color centers in diamond are indicated. The disclosure content of such publication with respect to color centers in diamond is hereby incorporated by reference in its entirety.

In an advantageous further development, it is provided that the means for generating the physical excitation or the further means for generating the physical excitation, as the case may be, provide an electrical or an electromagnetic excitation, preferably an excitation in the optical range and/or in the microwave range, in particular a LASER excitation or an LED excitation or an excitation by means of ionizing radiation. This makes it very easy to excite a luminescence or a photocurrent, as the case may be, and the means can be kept very compact. By using microwave excitation, fine structures in the luminescence or photocurrent spectrum can be resolved, further improving the accuracy of the generated reference value.

If electrical excitation (for example with electrical contacts) is used instead of electromagnetic excitation, then LEDs can be omitted for optical excitation, for example, which makes the corresponding sensor system much more compact. In addition, it would be possible to greatly increase the spatial resolution of a corresponding sensor. More specifically, excitation could be limited to a much smaller area by electrical contacts and, unlike optical detection, signals would not be obtained from the entire material. Until now, electrical excitation had failed because the NV center in diamond was ionized; however, this can be prevented by raising the Fermi level, for example, by phosphorus doping in diamond.

In an advantageous further development, it is provided that electrical contacts are transparent on the first material and/or the further material. For example, so-called "transparent conducting oxides (TCO)," such as indium tin oxide ("ITO"), fluorine tin oxide, aluminum zinc oxide or antimony tin oxide, could be used. Such contacts can be used both within the framework of reading the photocurrent and for electrical excitation.

Exemplary methods of electrical excitations of color centers in diamond are known, for example, from DE 43 22 830 A1 and from B. Burchard "Elektronische und optoelektronische Bauelemente und Bauelemente Grundstrukturen auf Diamantbasis," Dissertation, Hagen, 1994. In particular, the excitation of luminescence can be carried out by PIP or PIN diodes. In this regard, exemplary reference should also be made to B. Tegetmeyer et al., "Charge state modulation of nitrogen vacancy centers in diamond by applying a forward voltage across a p-i-n junction" Diamond and Related Materials, Volume 65, May 2016, pages 42-46 and B. Tegetmeyer et al., "Electroluminescence from silicon vacancy centers in diamond p-i-n diodes" Diamond and Related Materials Volume 65, May 2016, pages 42-46. Excitation via PN diodes is also conceivable. With the exemplary use of diamond and a PIP diode, when a sufficiently high voltage is applied to the PIP diode, a first doped region, for example a p+ doped region, injects charge carriers—in this case holes—into the intrinsic region. There, they are accelerated by the electric field of the applied voltage and excite the color centers by impacts, whereupon they start to glow. Excitation via injection of electrons and holes, for example in PIN diodes, is more efficient. By means of bandgap engineering or the use of other materials, direct transitions can also be created, but then other color centers must be used, since color centers always exist in a manner specific to the material. It is conceivable to couple LEDs, such as those described above, only capacitively or by means of transformers or otherwise in a manner galvanically isolated to an AC signal source. This is particularly advantageous for CMOS integration.

In an advantageous further development, it is provided that the means for magnetic field generation or the further means for magnetic field generation, as the case may be, comprise at least one coil, which can be excited by an electric current, wherein there is preferably a magnetic conductor, in particular in the form of a yoke with an air gap, wherein the first material and/or the further material are arranged in the air gap. This allows the magnetic field to be produced very easily and at the same time very homogeneously over the first material or the further material, as the case may be. Helmholtz coil arrangements can also be used, possibly combined with one or more yoke elements in order to achieve a concentration, wherein once again an air gap can be used.

In an advantageous further development, the means for measuring luminescence and/or the further means for measuring luminescence comprise a photodetector, and preferably a filter that attenuates the physical excitation. This makes it very easy to measure luminescence, wherein miniaturization is readily possible.

In an advantageous further development, it is provided that the means for measuring the photocurrent and/or the further means for measuring the photocurrent are formed in such a manner that a voltage is applied between two electrical contacts on the first material and the further material, as the case may be, and the photocurrent is measured in series, wherein the measurement is carried out, for example, with a lock-in amplifier or simply via the voltage drop across a known resistor. Photocurrent measurement could also be carried out using photodiodes and/or CCD elements and/or avalanche photodiodes and/or SPADs (single photon avalanche photodiodes). Another simple device for measuring the photocurrent is known from DE 10 2010 060 527 B3. When using such technology, the controllers must be clocked. They are then preferably implemented in whole or in part in switched-capacitor technology. At that point, the measurement of the photocurrent can be done particularly easily. In particular, the corresponding device can be set up in a particularly compact manner.

In an advantageous further development, it is provided that the means for control are formed as a continuous linear controller, preferably as a PI or PID controller. This enables particularly precise control to the extreme value of the resonance, which further improves the accuracy and stability of the reference value.

In an advantageous further development, it is provided that at least one high-pass filter exists for filtering the detection signal and/or the further detection signal. At that point, a high-frequency useful signal imposed on the magnetic field can be determined, by which a broadband information transmission is enabled. In addition, a magnetic background field can also be analyzed very precisely.

In an advantageous further development, it is provided that there is at least one low-pass filter for filtering the control signal. This low-pass filter can exist separately; however, the means for control can also provide such a low-pass filter function. This prevents high-frequency components from flowing into the control and not being present in the detection signal or only being present in a modified form.

In an advantageous further development, it is provided that the magnitude of the lower cut-off frequency of the high-pass filter is greater than the magnitude of the upper cut-off frequency of the low-pass filter or the means for control, as the case may be. At that point, the broadband information transmission or the analysis of the background magnetic field, as the case may be, is possible very precisely, wherein, in particular, disturbances in the control of the operating point of the magnetic flux density B acting on the material are prevented. The device can then be used for typically highly broadband reception of useful signals by means of naturally or artificially modulated electromagnetic radiation by evaluating the signal of the magnetic flux density. Naturally modulated radiation can be, for example, electromagnetic fields generated during the transport of nerve signals in organisms. The invention proposed herein, if suitably designed to detect such biologically modulated signals, can find particular application in medical technology. The device and method are therefore particularly suitable for electroencephalography.

In an advantageous further development, it is provided that the means for magnetic field generation have at least two, preferably three, magnetic regions that have different magnetic resistances, such that at least two, preferably three, material regions of the first material or of the further material, as the case may be, are exposed to different magnetic fields, wherein each material region is assigned its own means for measuring the luminescence or the photocurrent, as the case may be, with a respective detection signal that represents the strength of the detected luminescence signal or photocurrent signal, as the case may be, wherein the means for control are adapted to output a control signal for the control of the means for magnetic field generation and to control the magnetic field strength as a function of the detection signal in such a manner that the detection signal of a material region assumes an extreme value. This effectively prevents the means for control from "running out" of the resonance point. Preferably, the different magnetic resistances are adjusted so that the resulting deviation in the magnetic flux density B is not greater than the statistical value Sigma in the signal curve approximated as a Gaussian function at the resonance point. In particular, the magnetic resistances are to be adapted so that the resulting magnetic flux densities differ in the range of 0.5 to 3 mT, preferably 1-2 mT. At that point, a particularly stable control is achieved.

In an advantageous further development, it is provided that the means for magnetic field generation and/or the further means for magnetic field generation have magnetic shielding against external magnetic fields. At that point, the generated magnetic field strength is independent of external magnetic fields.

In an advantageous further development, it is provided that the means for generating the magnetic field are adapted to supply an external magnetic field to the material. At that point, such external magnetic fields can be analyzed particularly easily.

In an advantageous further development, it is provided that the means for generating the physical excitation are adapted to undertake a modulation of the physical excitation, wherein means exist for correlating the modulation of the physical excitation with the detection signal. Thus, there is a very precise and stable generation of the magnetic field strength.

A method for generating and controlling a magnetic field strength includes the use:
 of a first material that generates a luminescence and/or a photocurrent upon physical excitation, wherein the luminescence or the photocurrent, as the case may be, has an extreme value (in the form of a resonance) with respect to a magnetic field at at least one magnetic flux density,
 of means for generating the physical excitation,
 of means for magnetic field generation, wherein the first material is exposed to the generated magnetic field, wherein the magnetic field strength is adjustable, and
 of means for measuring the luminescence or the photocurrent, as the case may be, with a detection signal that represents the strength of the detected luminescence signal or photocurrent signal, as the case may be,
 wherein a control signal is output for controlling the means for magnetic field generation in order to control the magnetic field strength as a function of the detection signal such that the detection signal assumes an extreme value.

A receiver in accordance with the disclosure receives electromagnetic waves modulated with a useful signal with at least one color center, wherein the color center has a luminescence and wherein the luminescence is dependent on a magnetic flux density at the location of the color center, wherein the receiver is adapted to demodulate the useful signal via such luminescence and/or wherein the color center is an antenna for the modulated electromagnetic waves. This allows a broadband receiver to be provided, particularly for encrypted communications.

A color center may be used as an antenna as a sub-device for receiving and/or demodulating a modulated electromagnetic signal, in particular a modulated message or measurement signal.

Finally, a color center may be used as an antenna as a sub-device for receiving and/or demodulating a biologically modulated electromagnetic signal, in particular a modulated nerve signal.

In an advantageous further development, it is provided that the device in accordance with the invention is used.

The features and further advantages of the present invention will become apparent below from the description of preferred exemplary embodiments in connection with the figures.

BRIEF DESCRIPTION OF THE DRAWINGS

FIG. 1$b$ shows the dependence of the first derivative of the photoluminescence of a NV center in diamond on the magnitude of the magnetic flux density.

FIG. 2 illustrates the basic principle on which the present invention is based.

DETAILED DESCRIPTION

In the following, identical reference signs are used for identical elements.

Color centers are lattice defects in crystals that absorb electromagnetic radiation (for example in the UV, visible and/or IR range). This creates bands with a specific wavelength.

The so-called "nitrogen vacancy" (NV center) in diamond, one of over 100 known defects in diamond, which is caused by a carbon atom in the diamond lattice being substituted by a nitrogen atom, and the neighboring atom of which is missing, has been very well investigated. The type 1b diamond, with which such NV centers are uniformly distributed over the entire diamond structure, is known.

The photoluminescence of such NV center is strongly dependent on the magnetic flux of a magnetic field acting on the NV center.

Figure 1A:
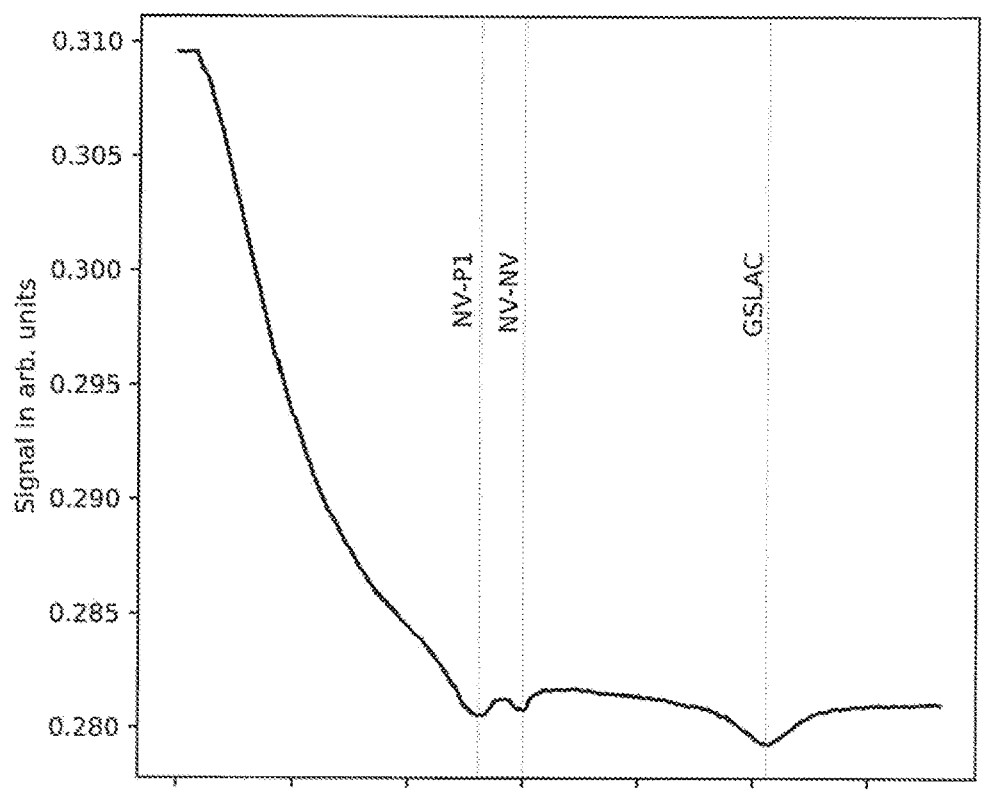
FIG. 1$a$ shows the dependence of the photoluminescence of a NV center in diamond on the magnitude of the magnetic flux density.
Figure 1B:
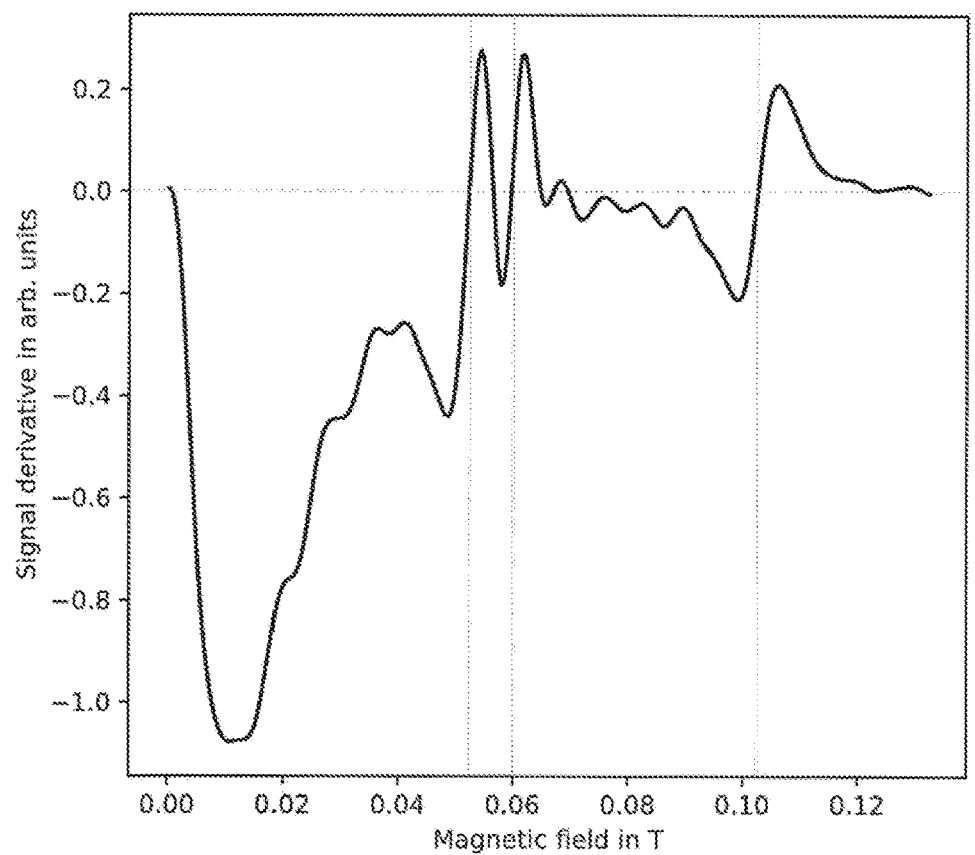

FIGS. 1a and 1b show the photoluminescence and the first derivative of the photoluminescence of such a NV center in diamond, as a function of the magnitude of the magnetic flux density, wherein the field is aligned in the NV axis. At a flux density of |B|=102.4 mT, the photoluminescence assumes a minimum. This flux density is also called "GSLAC flux density" (GSLAC—ground state level anti crossing). The theory predicts that photoluminescence should have a clear minimum here. The minimum is extremely sharp and has a contrast of more than 4.5%, which maximizes sensitivity. Moreover, this point does not depend on environmental parameters, which is a significant advantage. (Theoretically, there are dependencies on an external E-field, the pressure and the temperature. However, since such dependencies are very weak, they are negligible).

In addition, at about 60 mT, the NV-NV resonance and, at about 51.2 mT, the NV-P1 resonance exist.

Luminescence of negatively charged NV centers occurs in a wavelength range of 600-800 nm with a zero-phonon line at 638 nm. The NV center can be excited with wavelengths less than or equal to 638 nm. By means of impressed mechanical stresses in the crystal (for example by cavities or a high pressure), it is possible to shift the necessary excitation energies, and to change the luminescence characteristics.

FIG. 2 shows the electrical control circuit 10 of the basic principle of the present disclosure. It can be seen that the control circuit 10 has a magnetic subcircuit 12, which comprises, by way of example, a yoke arrangement 14 comprising, for example, two cores 16, 18 of preferentially ferromagnetic material (for example, an iron core), between which an air gap 20 is arranged. For example, the first core 16 is wound with a coil 22 having a certain number of windings, which is used to magnetically excite the magnetic subcircuit 12.

For example, the air gap 20 contains a type 1b diamond 24 with a NV center 26 as the luminescent material, which is irradiated by a LASER diode 28 with electromagnetic radiation 30 of a first wavelength, which is sufficient to excite photoluminescence in the diamond 24. The NV center 26 then emits electromagnetic radiation 32 of a second wavelength, which is different from the first wavelength. For example, the first wavelength is 532 nm and the second wavelength is in the range between 600 and 800 nm.

Furthermore, there is a photodetector 34 that receives the emitted radiation 32. In order to keep the electromagnetic radiation 30 of the first wavelength out of the reception path for the electromagnetic radiation 32 of the second wavelength, an optical filter 35 is inserted into the emission path, which does not let through or at least sufficiently attenuates the electromagnetic radiation 30 of the first wavelength, and which transmits the electromagnetic radiation 32 of the second wavelength or at least sufficiently transmits it without attenuation. Other optical components, such as beam splitters and the like, can also be provided in the optical path as needed.

The photodetector 34 detects the second wavelength electromagnetic radiation 32 and generates a detection signal 36 as a function of such detected second wavelength electromagnetic radiation 32 from the NV center 26. The value of the detection signal 36 is preferably proportional to the amplitude magnitude of the energy intensity of the electromagnetic radiation 32 of the second wavelength. At a minimum, however, the detection signal 36 is dependent on the energy intensity of the electromagnetic radiation 32 of the second wavelength.

Finally, a controller 38 is provided, which generates the control signal 40 from the detection signal 36 to control the coil 22 via the electrical conductor 42. The magnetic excitation generated by the coil 22 thus depends on the control signal 40. Thereby, the control of the controller 38 is selected to minimize the emission of electromagnetic radiation 32 of the second wavelength by the first NV center 26. Thereby, the controller is, for example, a PI or PID controller of known type, wherein a PID controller is preferred, with which control is performed on the zero point of the derivative of the detection signal measured by the photodetector 34. The derivative can be the first or second derivative of the detection signal.

With suitable magnetic shielding (not shown) of the diamond 24, the control signal 40 is dependent only on the geometric parameters of the magnetic subcircuit 12, such that the control signal 40 can be taken as the basis for a physical reference value. However, even if there is no magnetic shielding, the control signal 40 can be taken as the basis for a physical reference value, specifically if the magnitude of an external magnetic field, such as the earth's magnetic field, is known. Such an external magnetic field can be used to selectively reduce the control signal 40, which is useful for certain applications. In either case, the control circuit 10 provides a magnetic field strength H by exciting the coil 22.

For clarity, it is assumed that the luminescence L around the resonance site is approximated by the function $$L = L_0 \left[ 1 - e^{-\frac{(B-B_0)^2}{\sigma^2}} \right].$$

Thereby, the flux density $B_0$ is the position of the resonance point and $\sigma$ its width. At the beginning of the control, a starting value for the magnetic flux density B is to be taken, which ensures that the control proceeds in the direction of the luminescence extremum.

Just below the resonance point is the sensitivity $$\frac{\delta L}{\delta B} = -2 \frac{B-B_0}{\sigma^2} e^{-\frac{(B-B_0)^2}{\sigma^2}}.$$

Thus, the luminescence can be estimated as a function of the magnetic flux density B just below the resonance point $B_0$ at a location $B_k$ for a flux density deviation $\Delta B$ as $$L \sim L_0 - 2 \frac{B_k - B_0}{\sigma^2} e^{-\frac{(B_k-B_0)^2}{\sigma^2}} \Delta B.$$

Thus, as the level $P_{36}$ of the detection signal 36 of the photodetector 34, assuming that it provides a value proportional to the intensity of the luminescence L, the following is obtained:

$$P_{36} \sim k\left(L_0 - 2\frac{B_k - B_0}{\sigma^2} e^{-\frac{(B_k - B_0)^2}{\sigma^2}} \Delta B\right).$$

Thereby, k is a constant of proportionality. The controller 38 then provides an electrical current proportional to the level $P_{36}$ of the detection signal 36 from the photodetector 34. The integrating property of the controller 38, which is preferably a PI controller, is omitted here for simplicity, and only a variant with a P controller is described.

The control signal $R_{40}$ is then described as:

$$R_{40} \sim f * k * \left(L_0 - 2\frac{B_k - B_0}{\sigma^2} e^{-\frac{(B_k - B_0)^2}{\sigma^2}} \Delta B\right).$$

Thereby, f is another constant of the controller, typically the gain. The sign of -f is preferably selected in such a way that the change $\Delta B$ is compensated for later, so that stability is established. The coil 22 converts the control signal 40 into an additional magnetic excitation H, which acts as an additional magnetic flux $\Delta B_L$ again on the NV center 26. Thus, this results in $$\Delta B_L \sim g * f * k * \left(L_0 - 2\frac{B_k - B_0}{\sigma^2} e^{-\frac{(B_k - B_0)^2}{\sigma^2}} (\Delta B + \Delta B_L)\right)$$

Resolution according to $\Delta B_L$ giving rise to:

$$\Delta B_L \sim \frac{g * f * k * \left(L_0 - 2\frac{B_k - B_0}{\sigma^2} e^{-\frac{(B_k - B_0)^2}{\sigma^2}}\right)}{1 - g * f * k * \left(L_0 - 2\frac{B_k - B_0}{\sigma^2} e^{-\frac{(B_k - B_0)^2}{\sigma^2}}\right)} \Delta B$$

This can be written as:

$$\Delta B_L \sim \frac{1}{\frac{1}{g * f * k * \left(L_0 - 2\frac{B_k - B_0}{\sigma^2} e^{-\frac{(B_k - B_0)^2}{\sigma^2}}\right)} - 1} \Delta B$$

Now, the gain is adjusted to be very high, preferably in the range around $10^{10}$ or higher. At that point, if the sign of -f is selected correctly, the equation is simplified to:

$$\Delta B_L \sim \Delta B$$

Yet, this also means that $$R_{40} \sim f * k * \left(L_0 - 2\frac{B_k - B_0}{\sigma^2} e^{-\frac{(B_k - B_0)^2}{\sigma^2}} \Delta B_L\right).$$

The control signal is thus differentially proportional to the additional flux density $\Delta B_L$ superimposed in the NV center 26. Thus, the control signal 40 can be used as a measure for an additional superimposed magnetic flux density $\Delta B_L$.

By combining one NV center with different paramagnetic centers NV-EuV, NV-NV, NV-MgV, different calibration points can be generated and read out. Examples of other suitable centers are the St1 and L2 centers. The St1 center has an emission line of 581 nm and must be excited with light of higher energies than the NV center.

Furthermore, it is possible to create suitable spin systems in the form of suitable color centers in SiC and Si in place of the diamond 24 and the NV center in diamond 24.

Through the selection of suitable materials and their defects along with the suitable selection of the parameters of the magnetic subcircuit 12, the required magnetic flux density and thus also the required control signal 40 can thus be selected in a targeted manner.

Since, depending on the control algorithm, the magnetic flux density is preferably linearly dependent on the control signal 40, such control signal thus only needs to be calibrated once with respect to the actual parameters of the magnetic subcircuit 12, thus in particular the winding diameter, the number of windings, the conductor thickness and the yoke arrangement 14. In the case of high-precision manufacturing techniques, such as microtechnical manufacturing processes, calibration may not even be necessary.

Figure 3:
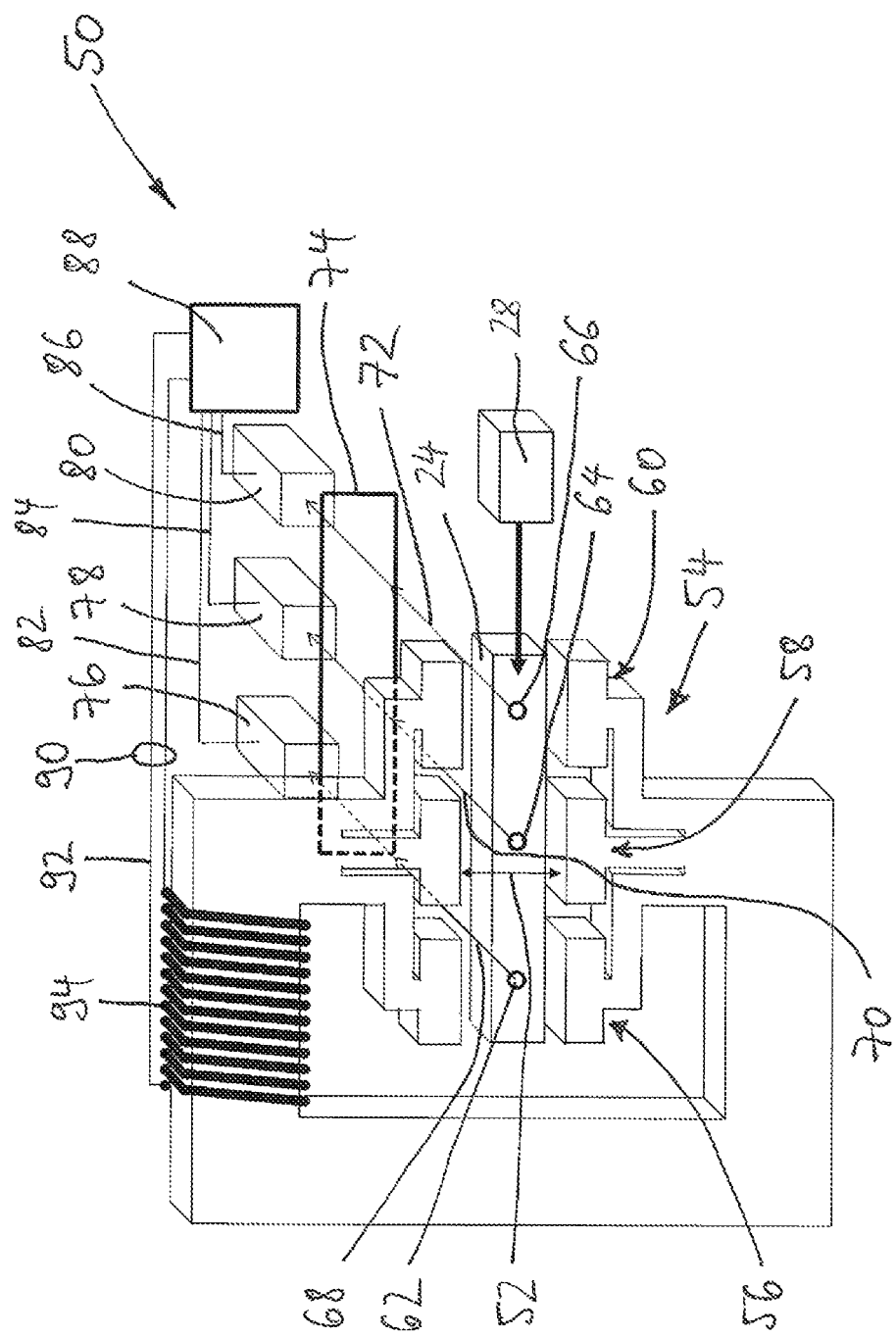
FIG. 3 shows an alternative embodiment of the basic principle according to FIG. 2.

FIG. 3 shows an alternative embodiment of the control loop 50. It can be seen that here, in turn, a luminescent material 24 is arranged in the air gap 52 of a yoke arrangement 54 and is irradiated by a LASER diode 28.

In contrast to the control circuit 10 according to FIG. 2, the yoke arrangement 54 here is closed except for the air gap 52, wherein, however, there are three different magnet regions 56, 58, 60 arranged parallel to each other at the air gap 52. Each of such magnetic regions 56, 58, 60 affects different NV centers 62, 64, 66 in the diamond 22, resulting in different electromagnetic radiations 68, 70, 72 of a second wavelength being emitted after excitation by the LASER diode 28 with an electromagnetic radiation 30 of a first wavelength. There is in turn a filter 74 for the electromagnetic radiation 30 of the first wavelength, and each electromagnetic radiation 68, 70, 72 of the second wavelength is received by a respective associated photodetector 76, 78, 80 and the corresponding detection signals 82, 84, 86 are fed as input signals to a PID controller 88, which outputs a control signal 90 via the electrical conductor 92 to generate an electric field strength by means of the coil 94.

The magnetic regions 56, 58, 60 are formed so that they each have different magnetic resistances. More specifically, for example, the magnetic regions 56, 58, 60 are formed such that the magnetic flux B in the gap 52 has a value B for the magnetic region 58, a value B−1 mT for the magnetic region 56, and a value B+1 mT for the magnetic region 60.

This realizes a multidimensional control, which prevents controller 88 from running outside the actual zero crossing of the first derivative of the GSLAC resonance point. Due to the spaced flux densities of the different magnet regions 56, 58, 60, the controller 88 always recognizes where it is located in the resonance point. The distance between the generated magnetic flux densities is preferably not more than the width of the resonance point, i.e. 1σ. Thus, the value of ±1 mT can also be selected differently, but it should not be greater than 1σ. Preferably, such distances are thereby selected symmetrically to a symmetry point.

It can be that only two such magnet regions are used, but three magnet regions 56, 58, 60 are preferred because, at that point, the second derivative of the detection signal, in this case the luminescence curve, can be formed. At that point, it is possible to control for zero crossings in this second derivative, i.e. maxima or minima, as the case may be, in the first derivative, wherein the highest control sensitivity exists.

In principle, such embodiment according to FIG. 3 can be advantageously used in all devices 100, 200, 300, 400, 500, 600, 700, 800 described below.

Figure 4:
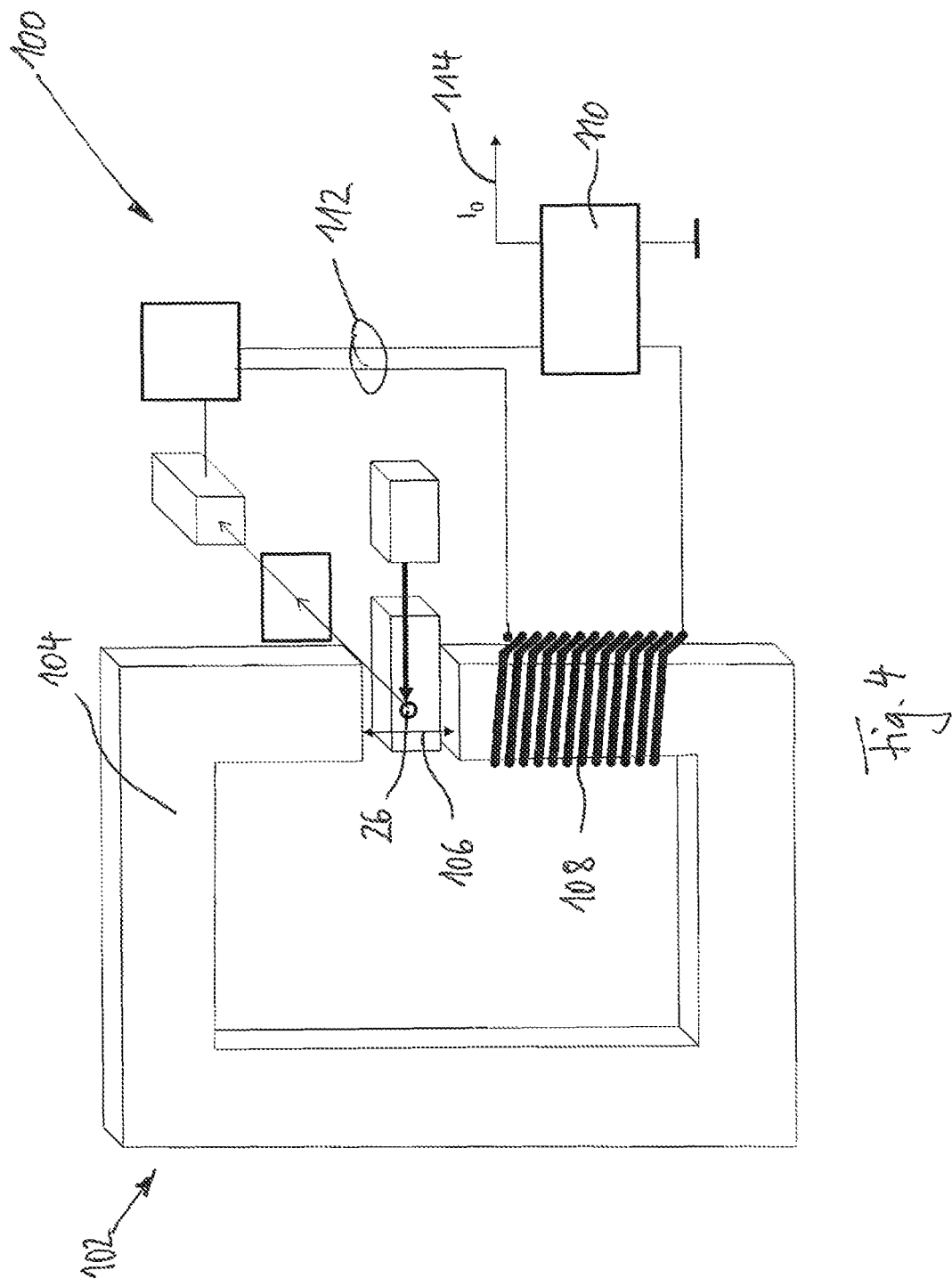
FIG. 4 shows a device for generating and controlling a magnetic field strength according to a first preferred embodiment.

FIG. 4 shows a first preferred embodiment of the device 100 for generating and controlling a magnetic field strength.

It can be seen that such device has essentially the control circuit 10 of FIG. 2, with the exception that, instead of the magnetic subcircuit 12 with the two cores 16, 18, a magnetic circuit 102 with a continuous magnetic yoke 104 with the air gap 106 has been selected here, by which the magnetic field induced by the coil 108 is particularly homogeneous in the air gap 106.

In other respects, the device 100 comprises an electric current mirror 110, by which the electric current for the coil 108 provided by the control signal 112 is converted into an output current 114 ($I_O$). If the device 100 is sufficiently shielded against irradiation of magnetic and electromagnetic fields from the outside, the magnitude $|I_O|$ of this current 114 is independent of environmental parameters. Therefore, the device 100 is suitable as a high accuracy reference current source. By adjusting different mirror ratios, it is very easy to adjust different reference current values, which are then determined only by the ratios of the transistor areas within the current mirror 110. With regard to circuit technology, reference is made here by way of example to Tietze, Schenk, "Halbleiter-Schaltungstechnik," Springer.

Figure 5:
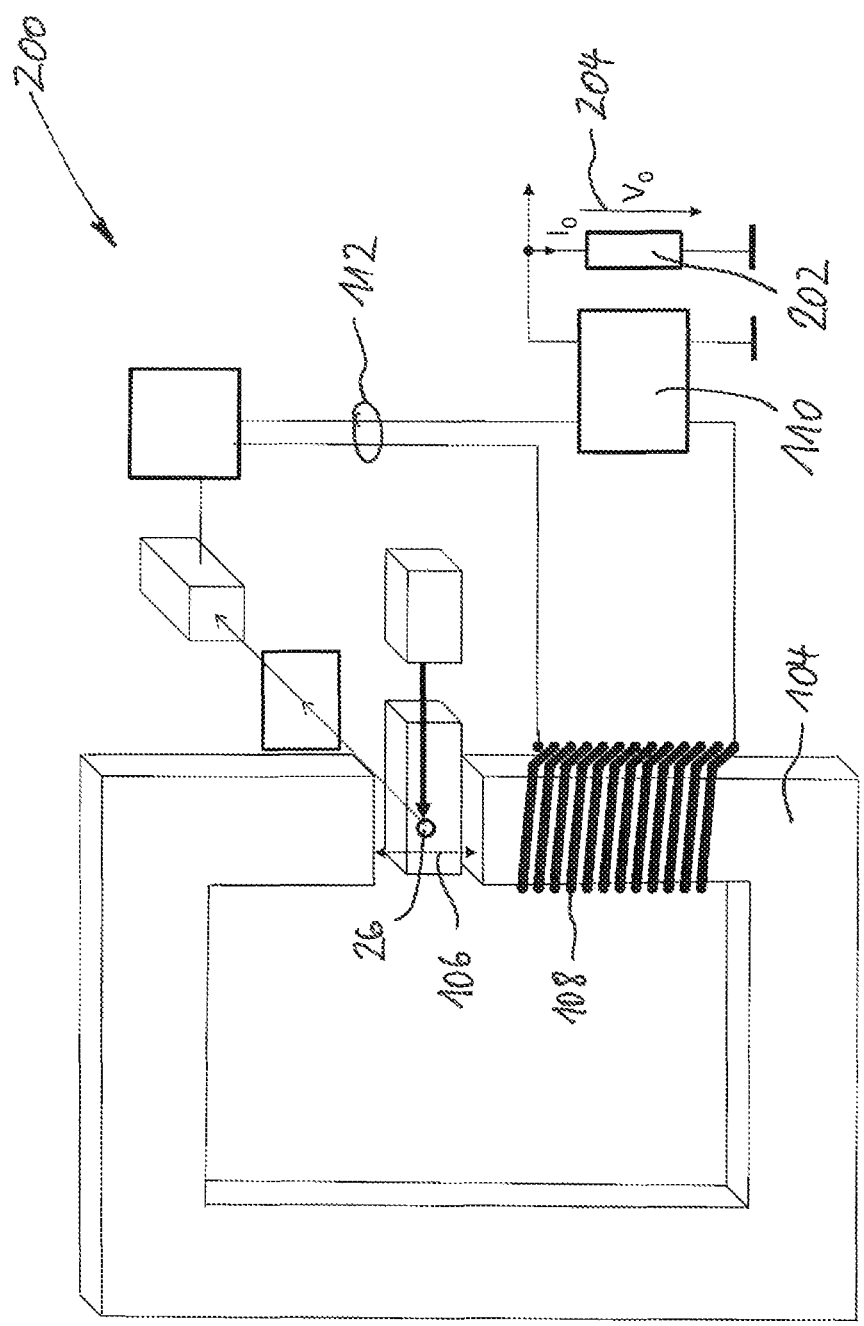
FIG. 5 shows a device for generating and controlling a magnetic field strength according to a second preferred embodiment.

FIG. 5 shows a second preferred embodiment of the device 200 for generating and controlling a magnetic field strength.

It can be seen that there is a modification in this regard with respect to the device 100 of FIG. 4, in that a resistor 202 is used as a source resistor in addition to the current mirror 110. Through this source resistor 202 (Rq), the output current 114 is converted to a reference voltage 204 ($V_O$). Therefore, the device 200 can be considered a high accuracy reference voltage source with internal resistor (Rq). Through the suitable selection or adjustment, as the case may be, of the source resistor 202 and/or suitable adjustment of the ratio of the current mirror 110, the value of the reference voltage 204 can be accurately determined.

Figure 6:
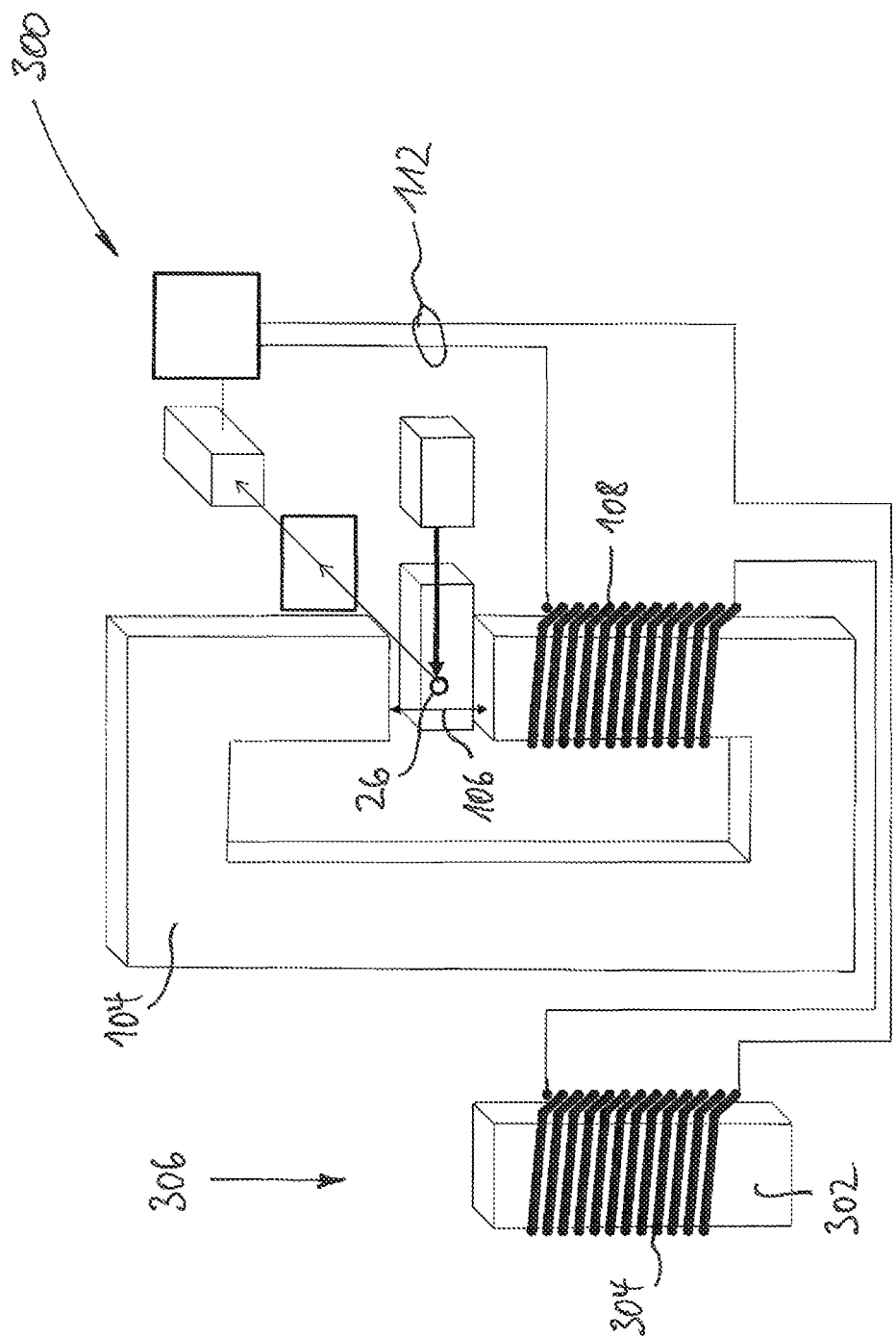
FIG. 6 shows a device for generating and controlling a magnetic field strength according to a third preferred embodiment.

FIG. 6 shows a third preferred embodiment of the device 300 for generating and controlling a magnetic field strength.

It can be seen that, unlike the device 100 of FIG. 4, no current mirror was used here, but a second coil 304 wound around a core 302 was connected in series with the first coil 108.

Through the selection of the geometry of the second coil 304 and the number of its coil windings and the materials of the core 302, the magnetic field of such second magnetic circuit 306 can be adjusted in a targeted manner. If necessary, a current divider (not shown) can be used to adjust in a targeted manner and, if necessary, adapt the excitation current of the second coil 304.

Thus, such device 300 provides a highly accurate reference source for a magnetic field, and specifically for a magnetic field strength H, which is generated by the magnetic subcircuit 306. Instead of such a magnetic subcircuit 306, magnetic circuits can of course also be used. With respect to the construction and use of magnetic circuits, reference is made to "Küpfmüller, Theoretische Elektrotechnik Elektromagnetische Felder, Schaltungen and elektronische Bauelemente," Springer.

Figure 7:
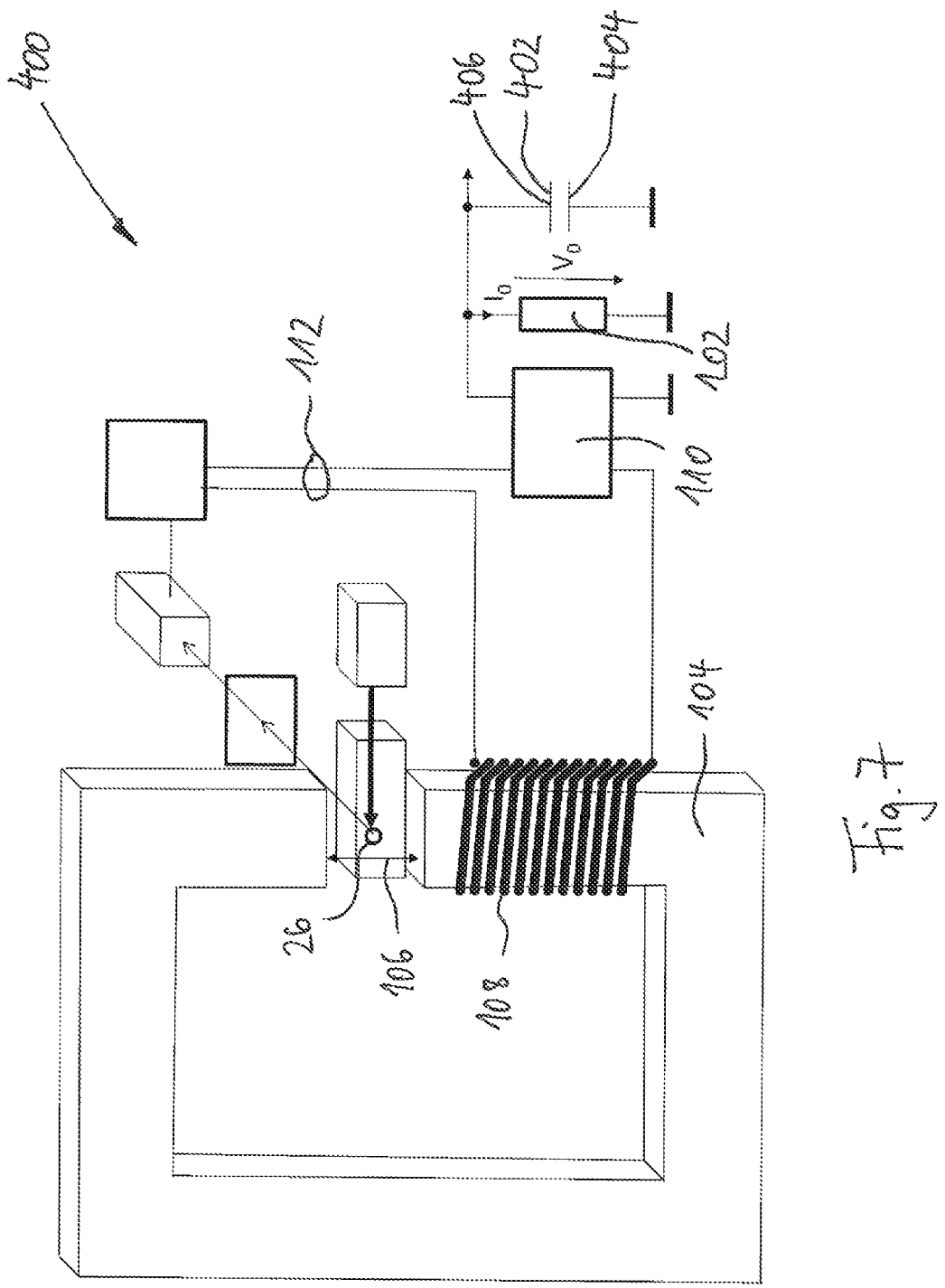
FIG. 7 shows a device for generating and controlling a magnetic field strength according to a fourth preferred embodiment.

FIG. 7 shows a fourth preferred embodiment of the device 400 for generating and controlling a magnetic field strength.

It can be seen that here, in contrast to the device 200 of FIG. 4, a capacitor 402 is connected in parallel in addition to the source resistor 202, by which the capacitor 402 charges until its voltage is identical to the voltage $V_O$ across the source resistor 202.

Through the selection of the geometry of the capacitor 402 and its materials, the electric field between the capacitor plates 404, 406 can be adjusted in a targeted manner. If necessary, a voltage divider (not shown) can be used to adjust in a targeted manner and, if necessary, adapt the excitation voltage of the capacitor 402.

Such device 400 thus provides a highly accurate reference source for an electric field within the capacitor 402.

On the other hand, the source resistor 202 could also be omitted, building up a voltage ramp across the capacitor 402 that can provide a reference time or a reference frequency, as the case may be.

Figure 8:
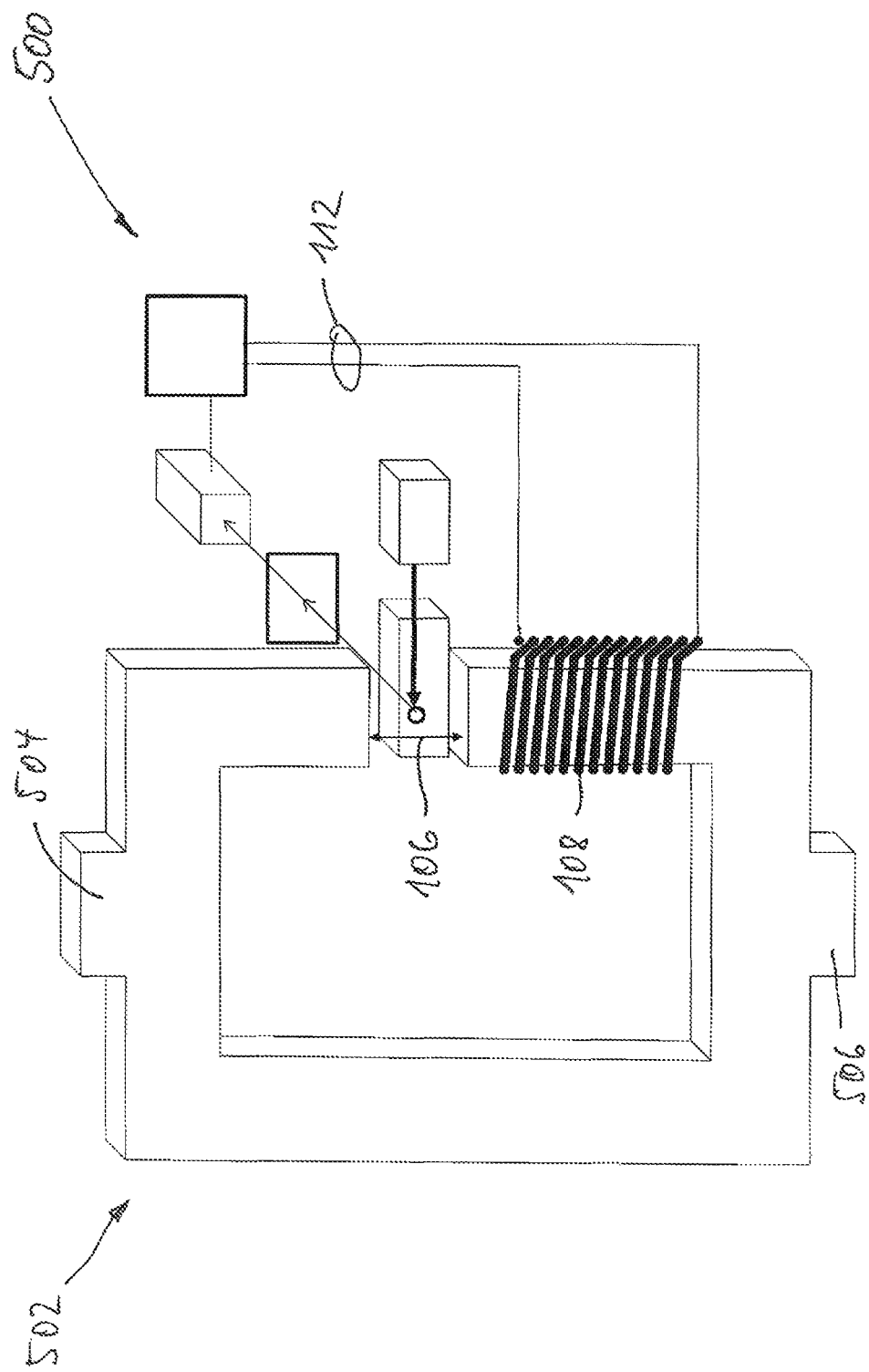
FIG. 8 shows a device for generating and controlling a magnetic field strength according to a fifth preferred embodiment.

FIG. 8 shows a fifth preferred embodiment of the device 500 for generating and controlling a magnetic field strength.

It can be seen that, in contrast to the control circuit 10, a magnetic circuit 502 corresponding to FIG. 4 is used here in principle, wherein, however, additional elements 504, 506 exist for introducing an external magnetic field.

The external magnetic field superimposes an external magnetic field strength on the magnetic field strength generated by the coil 108, by which the magnetic flux density in the gap 106 is defined. The external magnetic field strength can thus be calculated from the control signal 112.

Thus, such device 500 can be used to accurately determine an external magnetic field strength that is fed in.

Figure 9:
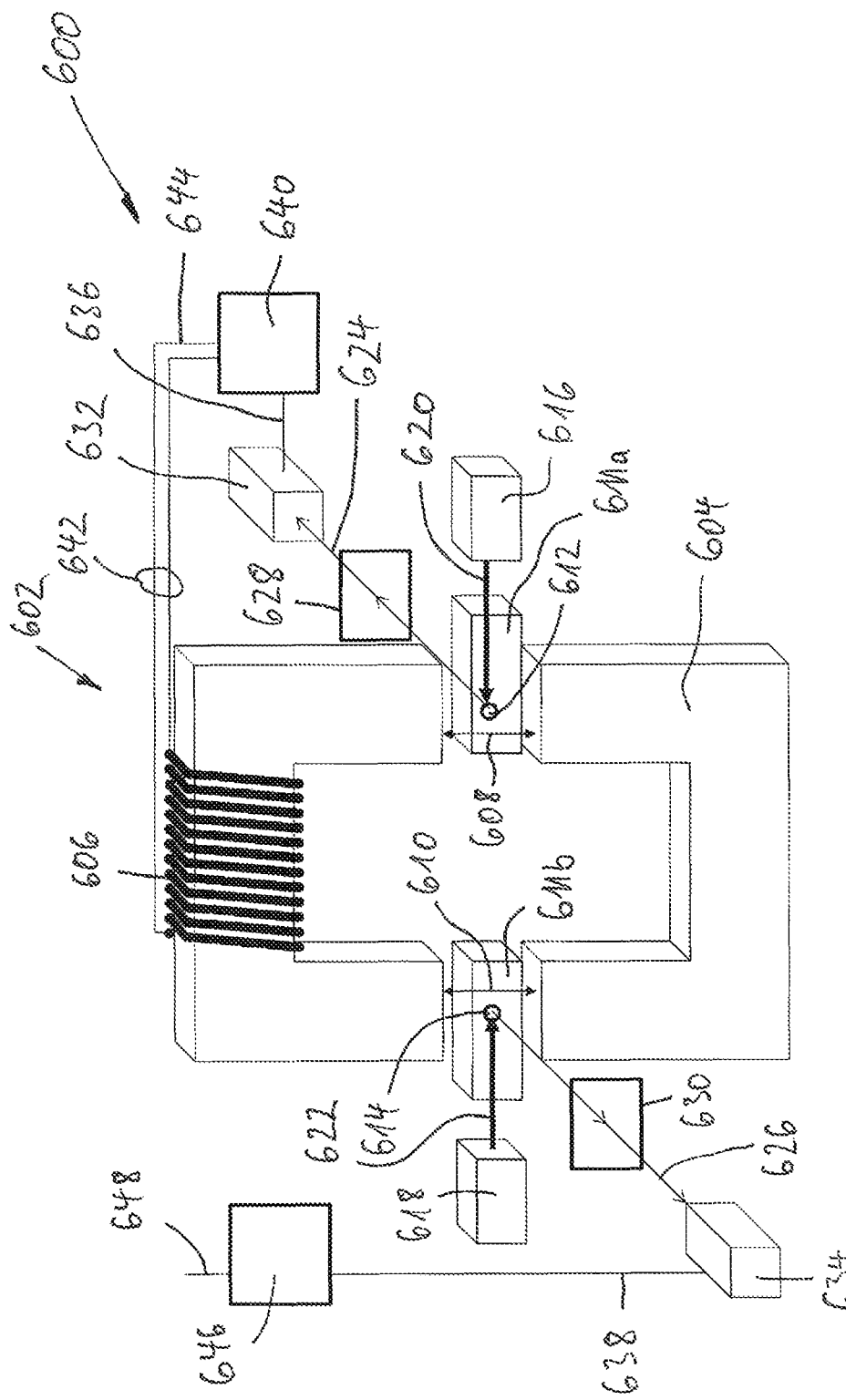
FIG. 9 shows a device for generating and controlling a magnetic field strength according to a sixth preferred embodiment.
Figure 10:
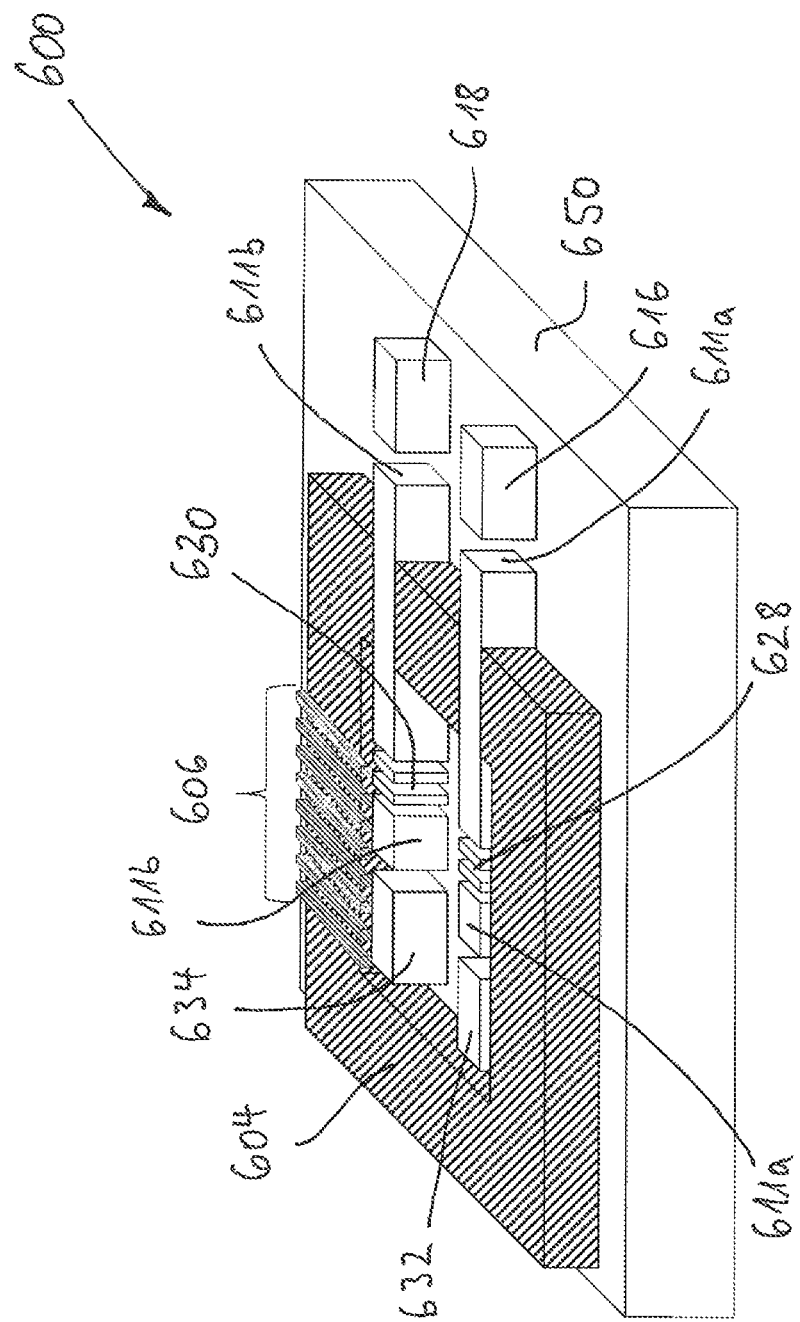
FIG. 10 shows the planar implementation of the sixth preferred embodiment according to FIG. 9.

FIGS. 9 and 10 show a sixth preferred embodiment of the device 600 for generating and controlling a magnetic field strength.

It can be seen that, here again, there is a magnetic circuit 602 formed by a yoke arrangement 604 and a coil 606, wherein there are two air gaps 608, 610 in the yoke arrangement. Each of the air gaps contains a diamond 611a, 611b with respective NV centers 612, 614, each of which is excited by LASER diodes 616, 618 with electromagnetic radiation 620, 622 of a first wavelength.

Electromagnetic radiation 624, 626 of a second wavelength emitted from the respective diamond 611a, 611b with NV centers 612, 614 is passed through a filter 628, 630, in order to filter on electromagnetic radiation 620, 622 of the first wavelength.

Photodetectors 632, 634 detect respective electromagnetic radiation 624, 626 of the second wavelength and generate a respective detection signal 636, 638 as a function of such detected electromagnetic radiation 624, 626 of the second wavelength of the NV centers 612, 614. The value of the detection signals 636, 638 is preferably proportional to the amplitude amount of the energy intensity of the respective electromagnetic radiation 624, 626 of the second wavelength. At least, however, the detection signal 636, 638 is dependent on the energy intensity, respectively, of the electromagnetic radiation 32 of the second wavelength.

Finally, on the side of the first NV center 612, a controller 640 is provided, which generates the control signal 642 from the detection signal 636 to control the coil 606 via the electrical conductor 644. The magnetic excitation generated by the coil 606 thus depends on the control signal 642. The control of the controller 640 is thereby in turn selected to minimize the emission of electromagnetic radiation 624 of the second wavelength by the first NV center 612. Thereby, the controller is, for example, a PI or PID controller of known type, wherein a PID controller is preferred, with which control is performed on the zero point of the derivative of the detection signal measured by the photodetector 632. The derivative can be the first or second derivative of the detection signal.

Since the second NV center 614 is identical to the first NV center 612 and the other magnetic components, in particular the magnetic resistance in the air gap 610, are also formed to be identical in principle, it is to be expected that the magnetic flux density B in both air gaps 608, 610 is identical and thus there is also a minimum for the detection signal 638 of the second NV center 614.

However, due to magnetic field gradients of a background field, such as the earth's magnetic field, there is a deviation from the minimum of the detection signal 638. Thus, from the magnitude of such deviation and the distance between the two NV centers 612, 614, such gradient of the magnetic flux density of the background field can be directly inferred. Thereby, calibration only needs to be undertaken once with respect to the strength of the magnetic field deviation with respect to the detection signal 638 for the second NV center 614. Since it is to be expected that the deviations in the magnetic field caused by the gradient are only very small over the distance between the two NV centers 612, 614, a measuring amplifier 646 is also provided, which outputs a corresponding measurement signal 648, which can be used to analyze the magnetic field gradient. Such embodiment of the device 600 can thus be used to determine a gradient in the background magnetic field with high accuracy.

FIG. 10 shows a planar embodiment of the device 600. It can be seen that all elements are arranged on a planar substrate 650. Such planar structure can be manufactured in a CMOS-compatible manner, wherein reference is made to DE 100 00 707 A1 for the generation in particular of the light sources (preferably LASER diodes) 616, 618, the disclosure content of which is fully incorporated in this respect.

If there is magnetic shielding (not shown) of the first NV center 612, at that point there is no influence of the magnetic background on the flux density B in the air gap 608. As a result, only the magnetic flux density B in the air gap 610 is determined by the magnetic background, such that the detection signal 638 is a measure of the background magnetic field. Thus, such alternative embodiment of the device 600 can be used to determine a background magnetic field with high accuracy.

Figure 11:
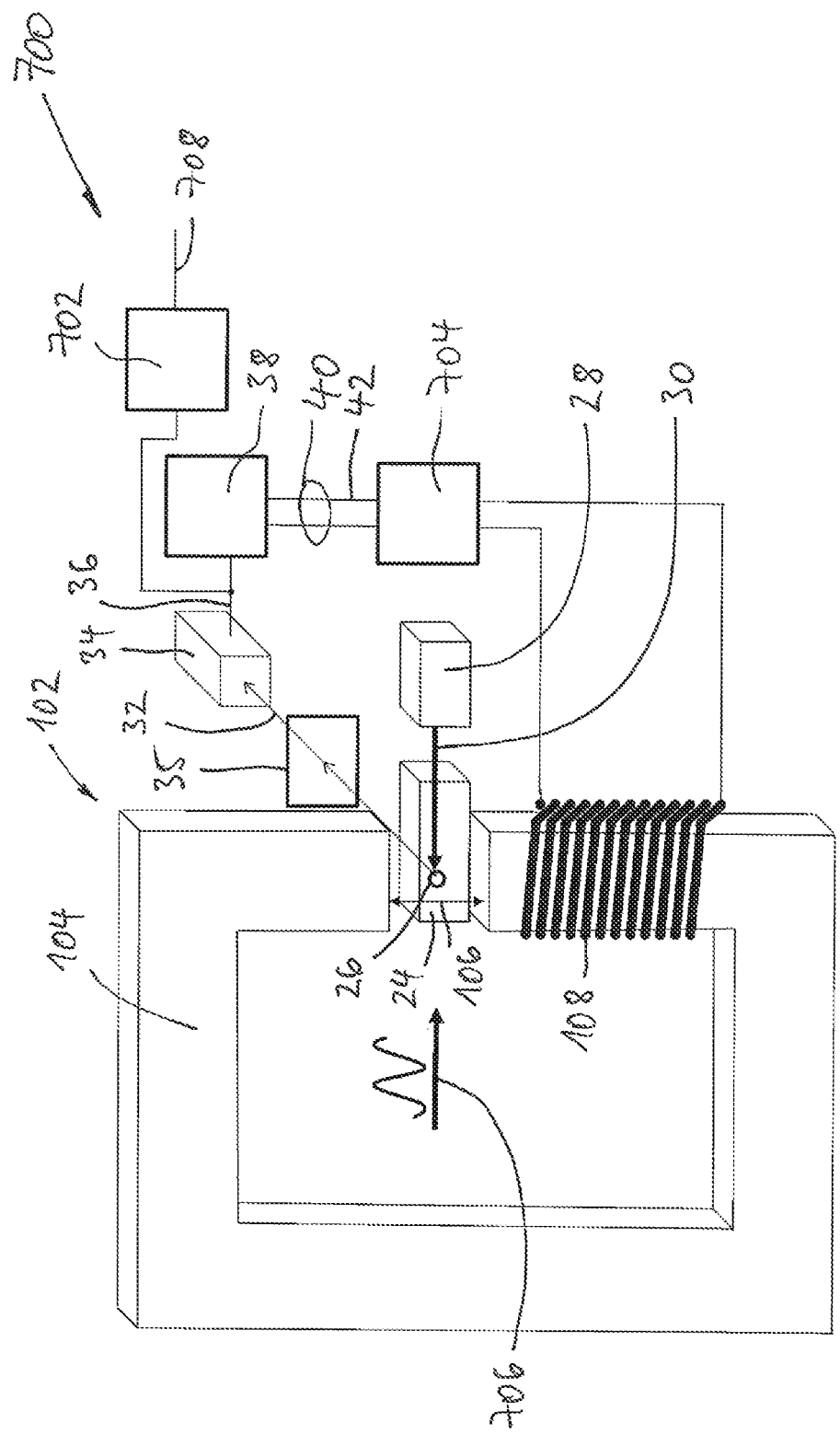
FIG. 11 shows a device for generating and controlling a magnetic field strength according to a seventh preferred embodiment.

FIG. 11 shows a seventh preferred embodiment of the device 700.

It can be seen that, here in turn, as in the device 100 of FIG. 4, there is a magnetic circuit 102 with a yoke 104, in whose air gap 106 a diamond 24 with a NV center 26 is arranged.

The NV center 26 is in turn excited by a LASER diode 28 with electromagnetic radiation 30 of the first wavelength, by which the NV center 26 emits electromagnetic radiation 32 of the second wavelength. This radiation is in turn filtered 35 and fed to a photodetector 34, which outputs the detection signal 36. This detection signal 36 is fed to the PID controller 38, which outputs the control signal 40 to the coil 108 via the current line 41.

In addition, there is a high-pass filter 702 with a lower cut-off frequency $f_{gu}$ for transmission. The controller 38 itself or an optionally provided low-pass filter 704 have an upper cut-off frequency $f_{go}$ for transmission. Such upper cut-off frequency $f_{go}$ is smaller than the lower cut-off frequency of the high-pass filter 702, in order to thereby prevent interference in the control of the operating point of the magnetic flux density B, which acts on the NV center 26.

Now, if an alternating electromagnetic field 706, such as a modulated magnetic field, is irradiated and acts on the NV center 26, the atoms or defects, as the case may be, involved will follow this alternating field 706 and the emitted fluorescence 32 will also be subject to modulation at a frequency that corresponds to the frequency of the alternating field 706.

Due to the controller 38 and its low-pass characteristic or the additional low-pass filter 704, as the case may be, there is no control on such modulation in the fluorescence if the frequency of the modulation is greater than the lower cut-off frequency $f_{gu}$ of the high-pass filter 702, such that only the basic fluorescence is controlled to a minimum by the controller 38, but the modulation remains. The resulting high-frequency modulation of the detection signal 36 is read out by the high-pass filter 702 and output as a useful signal 708.

Thus, the device 700 provides a highly sensitive antenna for the alternating magnetic field 706. Based on the structure of the device 700 and its physical operation, it is an extremely wide band receiver, which can be used for ultra-wide band communications in particular. The high-pass filter 702 can preferably be formed as a measuring amplifier.

In addition to analyzing the directed modulations by an alternating electromagnetic field 706, such device 700 can also be used to analyze the electromagnetic radiation spectrum or portions of the electromagnetic radiation spectrum at the location of the NV center 26.

As is familiar to those skilled in the art, analysis of the useful signal 708 can include demodulation using, for example, mixers and filters. Here, reference is made, for example, to M. Bossert, "Nachrichtenübertragung" Vieweg+ Teubner Verlag; Edition: 5., rev. ed. and add. edition 2011 (Aug. 4, 2011), A. Mertins, "Signaltheorie: Grundlagen der Signalbeschreibung, Filterbänke, Wavelets, Zeit-Frequenz-Analyse, Parameter- and Signalschätzung," Springer Vieweg; Edition: 3., revised and ext. edition 2013 (Dec. 8, 2012) along with Lüke, "Signal Transmission: Fundamentals of Digital and Analog Message Transmission Systems," Springer Vieweg; Edition: 12 (Feb. 19, 2015).

Figure 12:
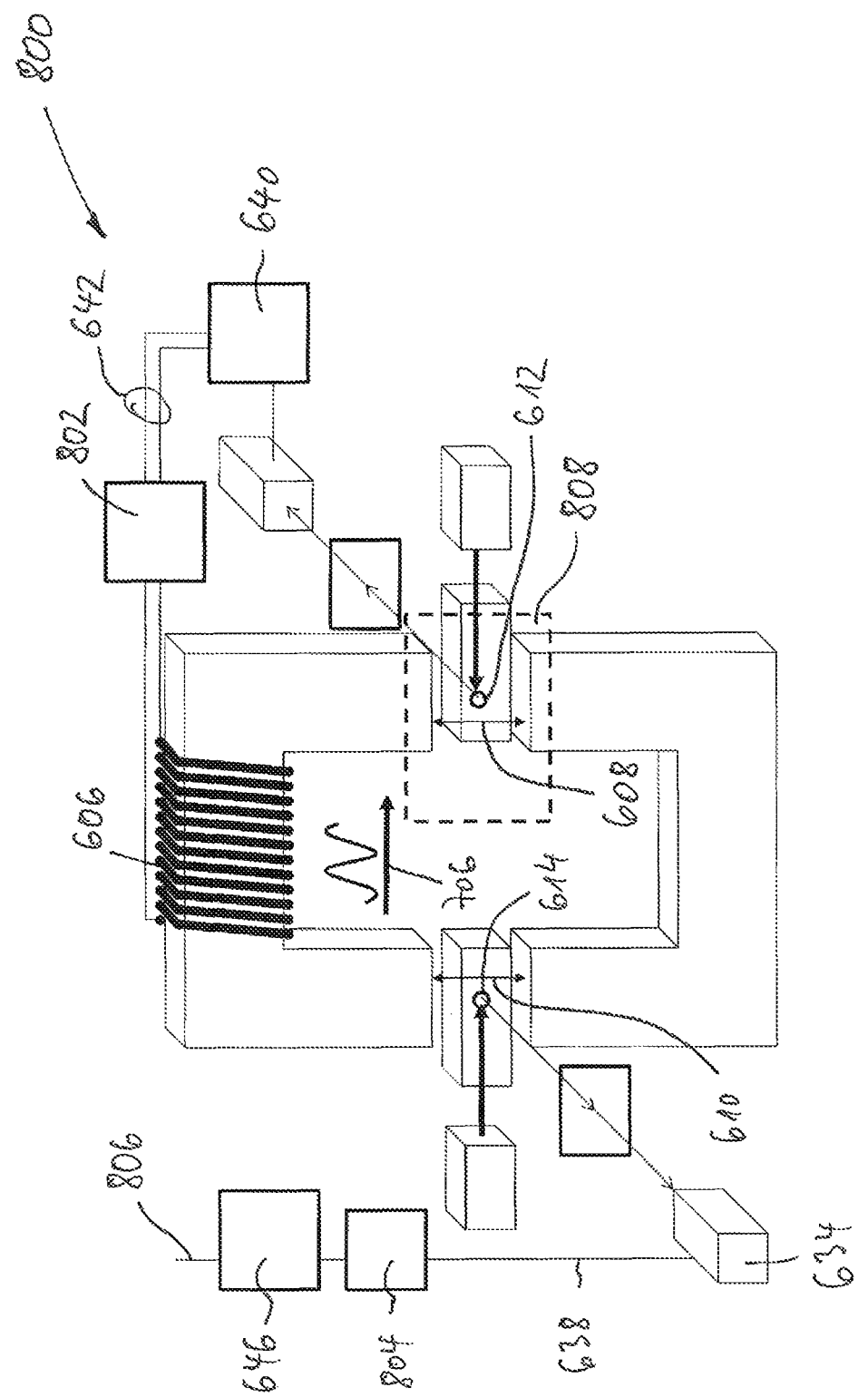
FIG. 12 shows a device for generating and controlling a magnetic field strength according to an eighth preferred embodiment.

FIG. 12 shows an eighth preferred embodiment of the device 800.

It can be seen that such device, which is an alternative to device 700 according to FIG. 11, is in principle based on the device 600 according to FIG. 9, wherein here, corresponding to the device 700 according to FIG. 11, the controller 640 has a low-pass characteristic or, optionally, there is a separate low-pass filter 802 with an upper cut-off frequency $f_{go}$ for transmission, which filters the control signal 642. In addition, the detection signal 638 from the photodetector 634 is filtered by the high-pass filter 804, which has a lower cut-off frequency $f_{gu}$ for transmission, and is fed to the sense amplifier 646, which outputs a corresponding useful signal 806. Furthermore, a magnetic shield 808, for example made of a soft magnetic material, exists to prevent influences of electromagnetic radiation 706 or an electromagnetic background on the NV center 612, as the case may be, in the air gap 608.

Due to the magnetic shielding 808, the magnetic flux density B in the air gap 608 is independent of external electromagnetic influences 706. The first NV center 612 thus serves as a reference center for controlling the magnetic field strength H by means of the coil 606 via the controller 640.

Only the second NV center 614 in the air gap 610 responds to the electromagnetic field 706, such that its high-frequency components can be analyzed by means of the high-pass filter 804.

Thus, such device 800 can provide even more accurate and stable information transmission or analysis, as the case may be, to background electromagnetic fields.

Figure 13:
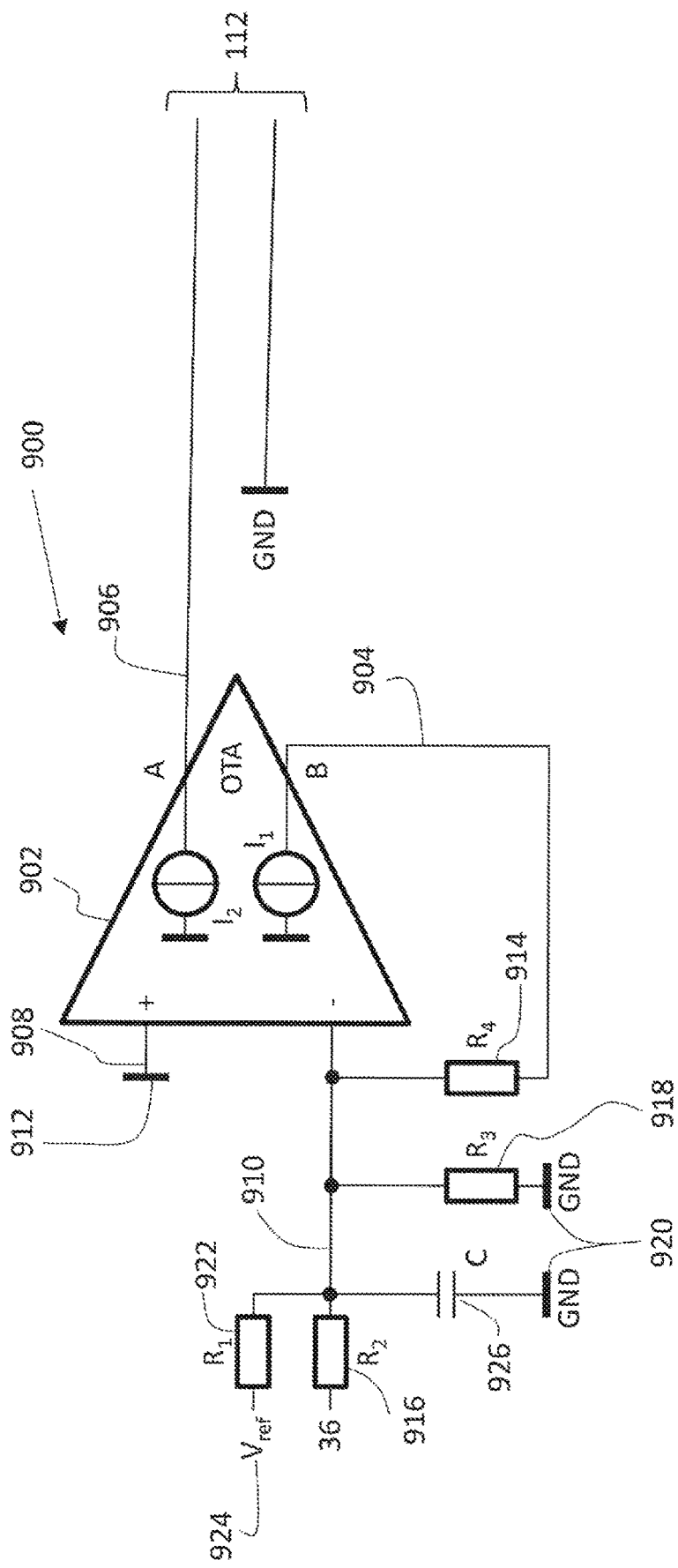
FIG. 13 shows a PI controller for use in one of the devices for generating and controlling a magnetic field strength.

FIG. 13 shows an example of a PI controller 900 that can be used as a controller 38, 88, 640, 646, 702 in any of the devices 10, 50, 100, 200, 300, 400, 500, 600, 700.

It can be seen that this PI controller 900 has a transconductance amplifier (OTA) 902 at its core. The OTA 902 shown here has two outputs 904, 906 formed by its two output current sources I1 and I2. The two current sources (I1) 904 and (I2) 906 are coupled together, and each generates an output current, which is proportional to the difference in the input voltages at the positive input (+) 908 minus the negative input (−) 910 with a respective constant of proportionality. The positive input (+) 908 is connected to a reference potential 912. The output current from the first output current source 904 (I1) of the OTA 902 is fed into the node of the negative input 910 (−) of the OTA 902 via the optional fourth resistor (R4) 914. The optional resistor (R4) 914 can also be bypassed and then be missing. The photodetector 34 feeds its voltage output signal through the terminal 36 and the resistor (R2) 916. Such two currents are transformed into the input voltage for the negative input (−) 910 of the OTA 902 via the working resistor (R3) 918, which is connected to the reference potential (GND) 920. For a suitable starting point of the control, an offset current from a reference voltage (Vref) 924 is fed in via the first resistor (R1) 922 in this example. The capacitor (C) 926 provides a low-pass characteristic of the controller, which then behaves like a PI controller at low frequencies. Here, the return line of the magnetic field exciting coil 108 is connected to the reference potential (GND) 920.

Note that the PI controller 900 does not have a current limit, which would cause the luminescence minimum to overflow. Therefore, such a limitation (not shown, but familiar to the expert) would have to be provided.

Figure 14:
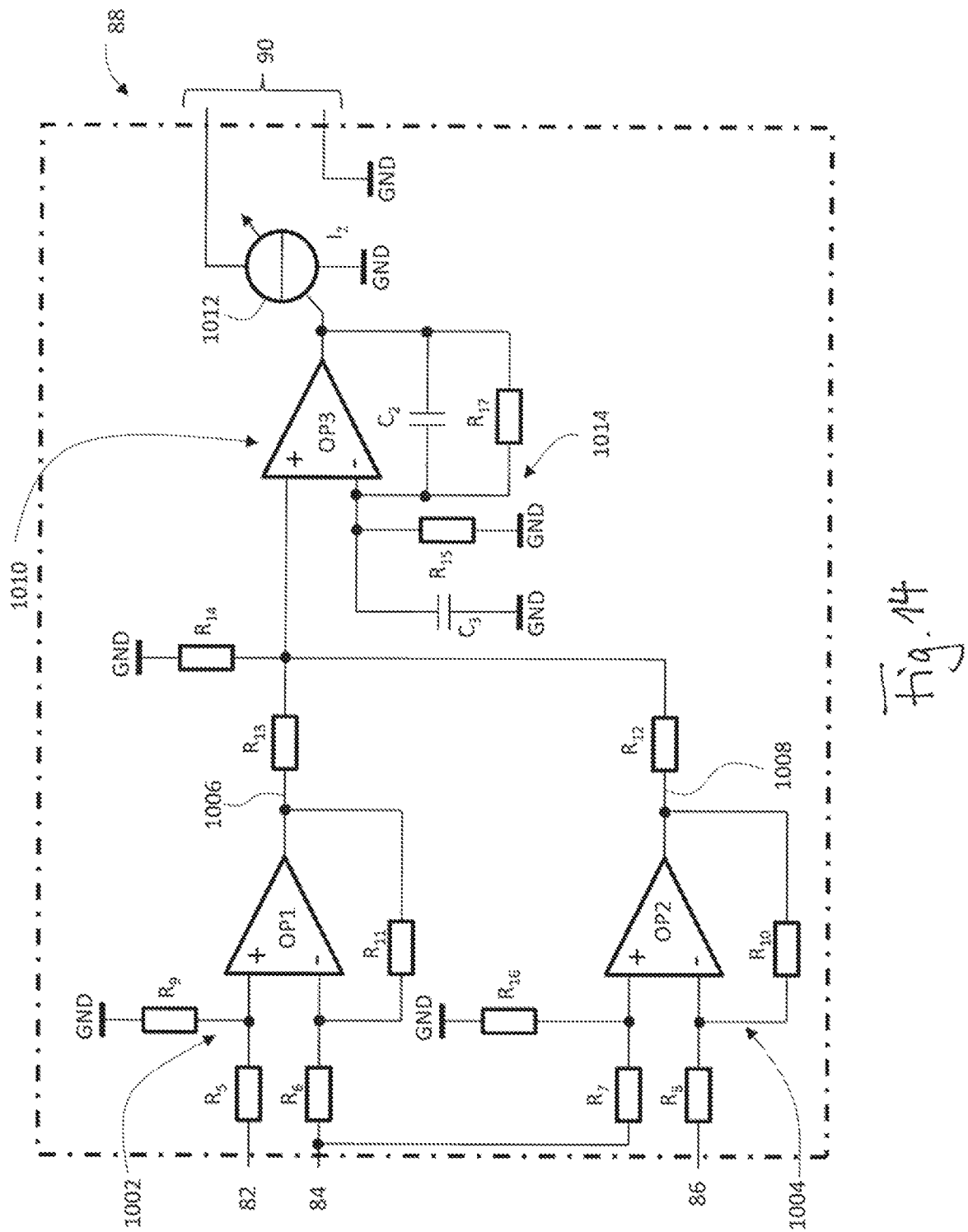
FIG. 14 shows a controller for use in the device according to FIG. 3.

FIG. 14 shows a controller 88 for use in the device in FIG. 3.

It can be seen that two gradient signals 1006, 1008 are formed from the three measurement signals 82, 84, 86 of the three photodetectors 76, 78, 80 by means of the two subtraction circuits 1002 (resistors R5, R4, R1, R11 and operational amplifier OP1) and 1004 (resistors R7, R8, R16, R10 and operational amplifier OP2). By means of the subsequent addition stage 1010 (R13, R12, R14, operational amplifier OP3), a sum signal is now formed, which is used to control the second current source (I2) 1012, which feeds the control signal 90 for the coil 94. The feedback network 1014 (R17, R15, C2, C3) is used here to realize a PID characteristic.

Figure 15:
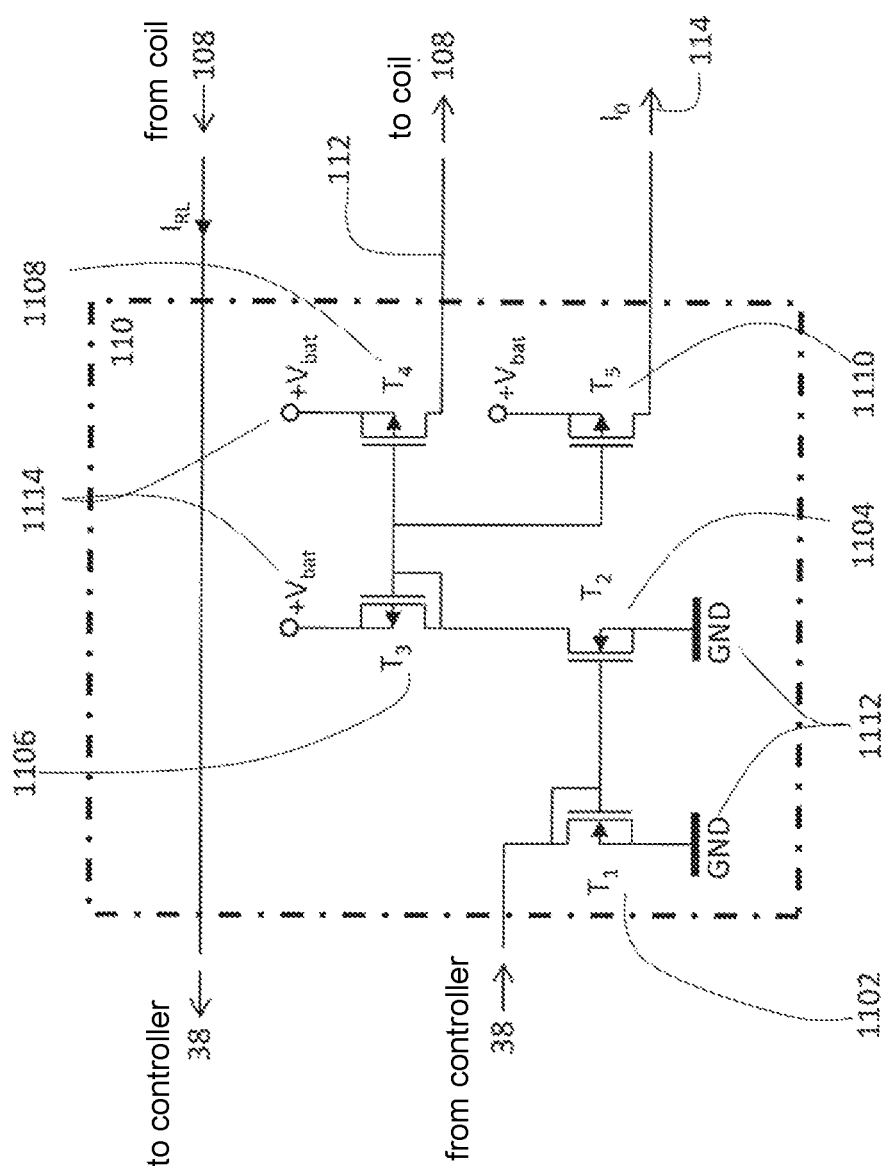
FIG. 15 shows a current mirror arrangement for use in one of the devices according to FIGS. 4, 5 or 7.

Finally, FIG. 15 shows a preferred embodiment of the current mirror arrangement 110, for example for use in one of the devices according to FIGS. 4, 5 or 7.

It can be seen that the current mirror arrangement 110 includes a first MOS transistor (T1) 1102, which is connected as a MOS diode. The first MOS transistor (T1) 1102 detects the current coming from the controller 38 and generates a reference signal, which is used to control the second transistor (T2) 1104 at its control electrode. Thereby, the second transistor (T2) 1104 operates as a current source for the cross current through the third transistor (T3) 1106. This cross current is determined by the ratio of transistors (T1) 1102 to (T2) 1104, as is known for current mirrors, for example, from Tietze, Schenk, "Halbleiter-Schaltungstechnik," Springer. Transistors (T1) 1102 and (T2) 1104 are preferably N-channel transistors in this example. The third transistor (T3) 1106 detects the cross current generated by the second transistor (T2) 1104 and is in turn connected as a MOS diode. It is preferably a P-channel transistor. It generates an internal reference voltage on whose value the currents generated by the two current source transistors (T4) 1108 and (T5) 1110 depend. Thereby, in the example, the fourth transistor (T4) 1108 provides the current 112 for controlling the magnetic field generating coil 108. In this example, the fifth transistor (T5) 1110 provides the reference current (I0) 114, which can then be used elsewhere in subsequent circuits 100, 200, 400.

Transistors (T3) 1106, (T4) 1108, and (T5) 1110 are preferably P-channel transistors in this example. The input current coming from the controller 38 through the transistor (T1) 1102 to ground (GND) 1112 has a fixed ratio to the cross current from the supply voltage (Vbat) 1114 through the third transistor (T3) 1106 and the second transistor (T2) 1104 to ground (GND) 1112, which is determined by the ratio of the transistors (T1) 1102 to (T2) 1104. The current from the supply voltage (Vbat) 1114 to coil 108, through coil 108 to ground (GND) 1112 depends on the magnitude of the cross current corresponding to the ratio of transistors (T3) 1006 to (T4) 1108, and is thus directly proportional to the input current through the transistor (T1) 1102. The generated reference current (I0) 114 from the supply voltage (Vbat) 1114 to the subsequent circuit 100, 200, 400 and from there to ground (GND) 1112 depends on the magnitude of the cross current corresponding to the ratio of transistors (T3) 1106 to (T5) 1108, and thus directly proportional to the input current through the transistor (T1) 1102. Moreover, obviously then the current 112 to the coil 108 and the reference current (I0) 114 are directly proportional to each other.

Although the invention has always been described within the framework of FIGS. 2 to 15 in connection with electromagnetic excitation by means of a LASER diode and the use of photodetectors for fluorescence, this is not mandatory. In fact, other excitations, in particular electrical excitations, for example by hot charge carriers in the surrounding material of a color center, and/or excitation can be used to read out, preferably electronically read out, the photocurrent. Since the luminescence is closely related to the photocurrent, the advantages described above also apply here. In addition, LEDs or other suitable light sources could be used in place of the preferred LASER diodes 28, 616, 618.

Even though the above refers to a single NV center in the material, ensembles of NV centers can also be used in the material. For one NV center, one achieves a very good spatial resolution, which is somewhat reduced when using NV centers. However, the signal strength increases when NV ensembles are used.

From the foregoing, it is clear that the present disclosure provides a device 10, 50, 100, 200, 300, 400, 500, 600, 700, 800 and a method for generating and controlling a magnetic field strength H, wherein the generation is very stable and precise. Preferably, reference values of physical variable can be generated relatively simply and economically. In addition, magnetic flux densities can be measured with high resolution and, in particular, highly robustly. The device can also be used transmitting information, in particular ultra-wide band communication. The required devices 10, 50, 100, 200, 300, 400, 500, 600, 700, 800 can be very small, in particular miniature, and mobile.

Unless otherwise indicated, all features can be freely combined. Also, unless otherwise indicated, the features described in the description of the figures can be freely combined with the other features. A limitation of individual features of the exemplary embodiments to the combination with other features of the exemplary embodiments is expressly not intended. In addition, the features of the device can also be reformulated and used as method features, and the method features can be reformulated and used as features of the device. Such a reformulation is thus automatically disclosed.

LIST OF REFERENCE SIGNS

10 Electrical control circuit
12 Magnetic subcircuit
14 Yoke arrangement
16, 18 Cores of yoke arrangement 14
20 Air gap
22 Coil
24 First material, type 1b diamond
26 NV center in first material, diamond 24
28 LASER diode
30 Electromagnetic radiation of first wavelength of LASER diode 28
32 Emitted electromagnetic radiation of second wavelength of NV center 26
34 Photodetector
35 Optical filter
36 Detection signal of the photodetector 34
38 Controller
40 Control signal of the controller 38 for controlling the coil 22
42 Electrical conductor
50 Alternative embodiment of the control circuit
52 Air gap
54 Yoke arrangement
56, 58, 60 Magnet regions at air gap 52 arranged in parallel
62, 64, 66 NV centers
68, 70, 72 Electromagnetic radiation of a second wavelength
74 Filter
76, 78, 80 Photodetectors
82, 84, 86 Detection signals of photodetectors 76, 78, 80
88 Controllers
90 Control signal of controller 88
92 Electrical conductor
94 Coil
100 First preferred embodiment of the device for generating and controlling a magnetic field strength
102 Magnetic circuit
104 Continuous magnetic yoke
106 Air gap
108 Coil
110 Current mirror
112 Control signal
114 Output current ($I_O$)
200 Second preferred embodiment of the device for generating and controlling a magnetic field strength
202 Resistor, source resistor (Rq)
204 Reference voltage ($V_O$)
300 Third preferred embodiment of the device for generating and controlling a magnetic field strength
302 Core
304 Coil
306 Second magnetic circuit
400 Fourth preferred embodiment of the device for generating and controlling a magnetic field strength
402 Capacitor
404, 406 Capacitor plates
500 Fifth preferred embodiment of the device for generating and controlling a magnetic field strength
502 Magnetic circuit
504, 506 Additional elements for introducing an external magnetic field
600 Sixth preferred embodiment of the device for generating and controlling a magnetic field strength
602 Magnetic circuit
604 Yoke arrangement
606 Coil
608, 610 Air gaps of yoke arrangement
611a First material, diamond
611b Further material, diamond
612, 614 NV centers
616, 618 LASER diodes
620, 622 Electromagnetic radiation of a first wavelength
624, 626 Electromagnetic radiation of a second wavelength emitted from NV centers 612, 614
628, 630 Filter
632, 634 Photodetectors
636, 638 Detection signal of photodetectors 632, 634
640 Controller
642 Control signal
644 Electrical conductor
646 Measuring amplifier
648 Measurement signal
650 Planar substrate
700 Seventh preferred embodiment of the device for generating and controlling a magnetic field strength
702 High-pass filter with a lower cut-off frequency $f_{gu}$ for transmission
704 Low-pass filter with an upper cut-off frequency $f_{go}$ for transmission
706 Electromagnetic alternating field
708 Useful signal
800 Eighth preferred embodiment of the device for generating and controlling a magnetic field strength
802 Low-pass filter with an upper cut-off frequency $f_{go}$ for transmission
804 High-pass filter with a lower cut-off frequency $f_{gu}$ for transmission
806 Useful signal
808 Magnetic shielding
900 PI controller for use as a controller 38, 88, 640, 646, 702
902 Transconductance amplifier (OTA)
904, 906 Outputs
904 Current source (I1)
906 Current source (I2)
908 Positive input (+)
910 Negative input (−)
912 Reference potential
914 Optional fourth resistor (R4)
916 Resistor (R2)
918 Working resistor (R3)
920 Reference potential (GND)
922 First resistor (R1)
924 Reference voltage (Vref)
926 Capacitor (C)
1000 Subtraction circuit (resistors R5, R4, R1, R11 and operational amplifier OP1)
1004 Subtraction circuit (resistors R7, R8, R16, R10 and operational amplifier OP2)
1006, 1008 Gradient signals
1010 Addition stage (R13, R12, R14, operational amplifier OP3)
1012 Second current source (I2)
1014 Feedback network (R17, R15, C2, C3)
1102 First MOS transistor (T1)
1104 Second transistor (T2)

1106 Third transistor (T3)
1108 Current source transistor (T4)
1110 Current source transistor (T5)
1112 Ground (GND)
1114 Supply voltage (Vbat)

The invention claimed is:

1. A device for generating and controlling a magnetic field strength, comprising:
a first material that generates a luminescence and/or a photocurrent upon a physical excitation, wherein the luminescence and/or photocurrent has an extreme value with respect to a magnetic field at at least one magnetic flux density;
means for generating the physical excitation;
means for magnetic field generation, wherein the first material is exposed to the generated magnetic field, wherein the magnetic field strength is adjustable;
means for measuring the luminescence or the photocurrent with a detection signal that represents a strength of a detected luminescence signal or photocurrent signal;
means for control, which are adapted to output a control signal for controlling the means for magnetic field generation and to control the magnetic field strength as a function of the detection signal, such that the detection signal assumes and maintains an extreme value.

2. The device according to claim 1,
further comprising means for generating a physical variable as a function of the control signal,
wherein the physical variable is a variable from the group consisting of electric current, electric voltage, magnetic field, electric field, time, and frequency.

3. The device according to claim 2,
wherein the means for generating the physical variable comprises at least one element selected from the group consisting of a current mirror, a resistor, a coil, a capacitor, a transconductance amplifier, and an operational amplifier.

4. The device according to claim 1, further comprising:
at least one further material that generates a luminescence and/or a photocurrent upon a further physical excitation, wherein the luminescence or the photocurrent has an extreme value with respect to a magnetic field at at least one magnetic flux density;
further means for generating the further physical excitation;
further means for magnetic field generation, wherein the further material is exposed to the generated magnetic field, wherein the magnetic field strength is adjustable, wherein the further means for magnetic field generation is adapted to expose the further material to the same or a different magnetic field as the first material;
further means for measuring the luminescence or the photocurrent of the further material with a further detection signal, which represents the strength of the detected further luminescence signal or the further photocurrent signal.

5. The device according to claim 1,
wherein the first material has a crystal structure with at least one vacancy, and
wherein the first material is diamond, silicon carbide or silicon, and
wherein the vacancy is a color center.

6. The device according to claim 1,
wherein the means for generating the physical excitation provide an electrical or an electromagnetic excitation in an optical range and/or in a microwave range by a LASER excitation or an LED excitation or an excitation by ionizing radiation.

7. The device according to claim 1,
wherein the means for magnetic field generation comprise at least one coil which can be excited by a current,
wherein there is a magnetic conductor in form of a yoke with an air gap, and
wherein the first material is arranged in the air gap.

8. The device according to claim 1,
wherein the means for measuring the luminescence comprise a photodetector and a filter that attenuates the physical excitation.

9. The device according to claim 1,
wherein the means for measuring the photocurrent are formed such that a voltage is applied between two electrical contacts on the first material and the photocurrent is measured in series.

10. The device according to claim 1,
wherein the means for control are formed as a continuous linear PI (proportional integral) or PID (proportional integral derivative) controller.

11. The device according to claim 1,
further comprising at least one high-pass filter for filtering the detection signal.

12. The device according to claim 1,
further comprising at least one low-pass filter for filtering the control signal.

13. The device according to claim 1, further comprising:
a high-pass filter for filtering the detection signal; and
a low-pass filter for filtering the control signal,
wherein a lower cut-off frequency of the high-pass filter is greater than an upper cut-off frequency of the low-pass filter.

14. The device according to claim 1
wherein the means for magnetic field generation comprise three magnet regions which have different magnetic resistances, such that three material regions of the first material are exposed to different magnetic fields,
wherein each material region is assigned its own means for measuring the luminescence or the photocurrent with a respective detection signal that represents a strength of the detected luminescence signal or photocurrent signal, and
wherein the means for control are adapted to output a control signal for controlling the means for magnetic field generation and to control the magnetic field strength as a function of the detection signal in such a manner that the detection signal of one of the three material region assumes an extreme value.

15. The device according to claim 1,
wherein the means for magnetic field generation comprise a magnetic shield against external magnetic fields.

16. The device according to claim 1,
wherein the means for generating the magnetic field are adapted to supply an external magnetic field to the first material.

17. The device according to claim 1,
wherein the means for generating the physical excitation are adapted to undertake a modulation of the physical excitation, and
wherein means exist for correlating the modulation of the physical excitation with the detection signal.

18. A method for generating and controlling a magnetic field strength, comprising:
providing a first material that generates a luminescence and/or a photocurrent upon physical excitation, wherein the luminescence or the photocurrent has an extreme value with respect to a magnetic field at at least one magnetic flux density;

providing means for generating the physical excitation;

providing means for magnetic field generation, wherein the first material is exposed to the generated magnetic field, wherein the magnetic field strength is adjustable;

providing means for measuring the luminescence or the photocurrent with a detection signal that represents the strength of a detected luminescence signal or photocurrent signal, and outputting a control signal for controlling the means for magnetic field generation to control the magnetic field strength as a function of the detection signal such that the detection signal assumes and maintains an extreme value.

* * * * *